(12) United States Patent
Sasaki

(10) Patent No.: US 11,574,821 B2
(45) Date of Patent: Feb. 7, 2023

(54) SUBSTRATE TREATING METHOD, SUBSTRATE TREATING LIQUID AND SUBSTRATE TREATING APPARATUS

(71) Applicant: SCREEN Holdings Co., Ltd., Kyoto (JP)

(72) Inventor: Yuta Sasaki, Kyoto (JP)

(73) Assignee: SCREEN Holdings Co., Ltd.

( * ) Notice: Subject to any disclaimer, the term of this patent is extended or adjusted under 35 U.S.C. 154(b) by 500 days.

(21) Appl. No.: 16/626,905

(22) PCT Filed: Jun. 12, 2018

(86) PCT No.: PCT/JP2018/022488
§ 371 (c)(1),
(2) Date: Dec. 27, 2019

(87) PCT Pub. No.: WO2019/021664
PCT Pub. Date: Jan. 31, 2019

(65) Prior Publication Data
US 2020/0135503 A1  Apr. 30, 2020

(30) Foreign Application Priority Data

Jul. 27, 2017  (JP) .............................. JP2017-145293
Jul. 28, 2017  (JP) .............................. JP2017-146883

(51) Int. Cl.
*C11D 7/50* (2006.01)
*H01L 21/67* (2006.01)
(Continued)

(52) U.S. Cl.
CPC .......... *H01L 21/67051* (2013.01); *B08B 3/04* (2013.01); *C11D 7/30* (2013.01);
(Continued)

(58) Field of Classification Search
CPC ............................................... C11D 11/0047
(Continued)

(56) References Cited

U.S. PATENT DOCUMENTS 5,348,893 A  9/1994 Yamagishi ................. 437/10
5,731,229 A * 3/1998 Kato .................. B81C 1/00896
438/50
(Continued)

FOREIGN PATENT DOCUMENTS

JP  H05-267307 A  10/1993
JP  2012-243869 A  12/2012
(Continued)

OTHER PUBLICATIONS

International Search Report dated Sep. 11, 2018 in corresponding PCT International Application No. PCT/JP2018/022488.
(Continued)

*Primary Examiner* — Gregory E Webb
(74) *Attorney, Agent, or Firm* — Ostrolenk Faber LLP

(57) ABSTRACT

A substrate treating method, liquid and apparatus are provided which can reduce the amount of sublimable substance used for the drying of a substrate while reducing the collapse of pattern. The substrate treating method includes a step of supplying a liquid to the pattern-formed surface of the substrate, a step of solidifying the liquid on the pattern-formed surface to form a solidified body and a step of subliming the solidified body so as to remove it from the pattern-formed surface. The substrate treating liquid includes a molten sublimable substance and a solvent, the freezing point of the sublimable substance being higher than the freezing point of the solvent. When the sublimable substance and the solvent are separated, the sublimable substance is settled and in the solidification step, the settled sublimable substance is solidified to have a height equal to or higher than the height of a pattern.

12 Claims, 8 Drawing Sheets

(51) Int. Cl.
  *H01L 21/02* (2006.01)
  *B08B 3/04* (2006.01)
  *C11D 11/00* (2006.01)
  *C11D 7/32* (2006.01)
  *C11D 7/36* (2006.01)
  *C11D 7/30* (2006.01)

(52) U.S. Cl.
  CPC ............... *C11D 7/32* (2013.01); *C11D 7/36* (2013.01); *C11D 11/0047* (2013.01); *C11D 11/0058* (2013.01); *H01L 21/02057* (2013.01)

(58) Field of Classification Search
  USPC ........................................................ 510/175
  See application file for complete search history.

(56) References Cited

U.S. PATENT DOCUMENTS

| 2012/0073599 A1 | 3/2012 | Miya et al. ............... 134/4 |
| 2013/0008868 A1 | 1/2013 | Uozumi et al. ............ 216/41 |
| 2015/0273535 A1* | 10/2015 | Sato ............... H01L 21/67109 134/105 |
| 2016/0365240 A1 | 12/2016 | Sugita et al. |
| 2017/0062244 A1* | 3/2017 | Sato ............... H01L 21/02057 |

FOREIGN PATENT DOCUMENTS

| JP | 2013-016699 A | 1/2013 |
| JP | 2013-042094 A | 2/2013 |
| JP | 2013-25 8272 A | 12/2013 |
| JP | 2015-037128 A | 2/2015 |
| JP | 2015-050414 A | 3/2015 |
| JP | 2015-142069 A | 8/2015 |
| JP | 2017-005134 A | 1/2017 |
| JP | 2017-037985 A | 2/2017 |
| TW | 201214534 A1 | 4/2012 |
| TW | 201606072 A | 2/2016 |
| WO | WO 2015/189697 A1 | 12/2015 |

OTHER PUBLICATIONS

Written Opinion dated Sep. 11, 2018 in corresponding PCT International Application No. PCT/JP2018/022488.

\* cited by examiner

SUBSTRATE TREATING METHOD, SUBSTRATE TREATING LIQUID AND SUBSTRATE TREATING APPARATUS

CROSS-REFERENCE TO RELATED APPLICATIONS

The present application is a 35 U.S.C. §§ 371 national phase conversion of PCT/JP2018/022488, filed Jun. 12, 2018, which claims priority to Japanese Patent Application Nos. 2017-145293 and 2017-146883, filed Jul. 27, 2017 and Jul. 28, 2017, respectively, the contents of both of which are incorporated herein by reference. The PCT International Application was published in the Japanese language.

TECHNICAL FIELD

The present invention relates to a substrate treating method, a substrate treating liquid and a substrate treating apparatus which remove, from substrates, liquids adhered to various types of substrates such as a semiconductor substrate, a substrate for a photomask glass, a substrate for a liquid crystal display glass, a substrate for a plasma display glass, a FED (Field Emission Display) substrate, a substrate for an optical disc, a substrate for a magnetic disc and a substrate for a magneto-optical disc.

BACKGROUND ART

In the manufacturing process of an electronic component such as a semiconductor device or a liquid crystal display device, various types of wet processing using liquids are performed on a substrate, and thereafter drying treatment for removing the liquids adhered to the substrate in the wet processing is performed on the substrate.

As the wet processing, washing treatment which removes contaminants on the surface of the substrate can be considered. For example, on the surface of a substrate in which a fine pattern having recesses and projections is formed after a dry etching step, a reaction byproduct (etching residue) is present. In addition to the etching residue, a metal impurity, an organic contaminant and the like may be adhered to the surface of the substrate, and in order to remove these substances, washing treatment of, for example, supplying a washing liquid to the substrate is performed.

After the washing treatment, rinsing treatment to remove the washing liquid using a rinse liquid and drying treatment to dry the rinse liquid are performed. Such rinsing treatment includes, as an example, rinsing to supply a rinse liquid such as deionized water (DIW) to the substrate surface to which the washing liquid is adhered, so as to remove the washing liquid from the substrate surface. Thereafter, the drying treatment is performed to remove the rinse liquid so as to dry the substrate.

In recent years, as a finer pattern has been formed on a substrate, the aspect ratio of a projection in a pattern having recesses and projections (the ratio between the height and the width of the projection in the pattern) has been increased. Hence, there is a problem of a so-called pattern collapse in which, at the time of drying treatment, surface tension that acts on a boundary surface between a liquid such as a washing liquid or a rinse liquid in recesses in the pattern and a gas in contact with the liquid pulls and collapses the adjacent projections in the pattern.

As a drying technology for preventing such a collapse of the pattern caused by surface tension, for example, Patent literature 1 discloses a method wherein a solution is brought into contact with a substrate where a structure (pattern) is formed so as to change the solution into a solid form, the solid is then used as a support member for the pattern and the support member is removed by being changed from a solid phase to a gas phase without an intermediate phase of liquid. Patent literature 1 discloses that as a support member, a sublimable substance is used which is at least any of a methacrylic resin material, a styrene resin material and a fluorocarbon material.

Patent literatures 2 and 3 disclose drying technologies in which the solution of a sublimable substance is supplied onto a substrate, in which a solvent in the solution is dried so that the substrate surface is filled with the sublimable substance in a solid phase and thus the sublimable substance is sublimed. It is assumed that according to these patent literatures, since a surface tension does not act on a boundary surface between the solidified body and a gas in contact with the solidified body, it is possible to reduce the collapse of the pattern caused by the surface tension.

Patent literature 4 discloses a dry technology (freeze drying) in which the melt of t-butanol (sublimable substance) is supplied to a substrate on which a liquid is adhered, in which t-butanol is solidified on the substrate so as to form a solidified body and in which the solidified body is thereafter removed by being sublimed.

Although all the methods disclosed in patent literatures 1 to 4 are effective for the collapse of a pattern caused by the surface tension of a sublimable substance on the pattern, in addition thereto, in a dry technology for a substrate, it is also required that only a small amount of residue be left on the dried substrate and that the amount of processing (drying speed) per unit time be large. In order to satisfy these requirements, as the features of the sublimable substance, it is necessary that the sublimable substance have a high purity, that the sublimable substance contain only an extremely small amount of impurity, that the sublimable substance have a high vapor pressure in a solid state and that the solidification temperature thereof be around room temperature. However, since the sublimable substance having these features is expensive, when the sublimable substance described above is used, a cost of drying the substrate is disadvantageously increased. Hence, it is important to reduce the amount of sublimable substance used for the drying of the substrate.

PRIOR ART DOCUMENT

Patent Literatures

Patent Literature 1: JP 2013-16699 A
Patent Literature 2: JP 2012-243869 A
Patent Literature 3: JP 2013-258272 A
Patent Literature 4: JP 2015-142069 A

SUMMARY OF INVENTION

Technical Problem

The present invention is made in view of the foregoing problem, and has an object to provide a substrate treating method, a substrate treating liquid and a substrate treating apparatus which can reduce the amount of sublimable substance used for the drying of a substrate while reducing the collapse of a pattern.

Solution to Problem

In order to solve the above-mentioned problems, the substrate treating method comprises a supply step of supplying a substrate treating liquid to a pattern-formed surface of a substrate, a solidification step of solidifying the substrate treating liquid on the pattern-formed surface so as to form a solidified body and a sublimation step of subliming the solidified body so as to remove the solidified body from the pattern-formed surface, wherein as the substrate treating liquid, a substrate treating liquid is used which includes a sublimable substance in a molten state and a solvent, a freezing point of the sublimable substance is higher than a freezing point of the substrate treating liquid, and when solubility of the sublimable substance in the solvent is lowered, an excessive amount of the sublimable substance whose density is higher than a density of the substrate treating liquid is settled, and in the solidification step, in the substrate treating liquid supplied to the pattern-formed surface in the supply step, the solubility of the sublimable substance in the solvent is lowered such that the excessive amount of the sublimable substance is settled, and the settled sublimable substance is solidified so as to have a height equal to or higher than a height of a pattern in the pattern-formed surface.

In the configuration described above, as the substrate treating liquid for removing liquids present on the pattern-formed surface of the substrate by the principle of freeze drying (or sublimation drying), the substrate treating liquid is used which includes the sublimable substance in the molten state and the solvent, and in which when the freezing point of the sublimable substance is higher than the freezing point of the substrate treating liquid and the solubility of the sublimable substance in the solvent is lowered, an excessive amount of the sublimable substance whose density is higher than the density of the substrate treating liquid is settled. In the configuration described above, the substrate treating liquid described above is first supplied to the pattern-formed surface of the substrate so as to form a liquid film of the substrate treating liquid (supply step), and the liquid film is solidified (solidification step). Here, in the solidification step, the solubility of the sublimable substance in the liquid film in the solvent is lowered. Here, the sublimable substance is higher in density than the substrate treating liquid, and thus an amount of sublimable substance which is so excessive as to appear is settled in a lower portion of the liquid film. Moreover, the sublimable substance is higher in freezing point than the substrate treating liquid, and thus the solidification of the excessive amount of sublimable substance settled is first started. Furthermore, after the solidification of the excessive amount of sublimable substance settled, the liquid layer part of the saturated solution of the sublimable substance is solidified, and thus the solidified body is formed on the pattern-formed surface. In the configuration described above, in the solidification step, a case where the liquid layer part of the saturated solution of the sublimable substance in the liquid film is not solidified can be included.

Here, in the configuration described above, the solidified part of the sublimable substance settled is set equal to or higher than at least the pattern in the pattern-formed surface. In this way, the pattern-formed surface can be covered up to at least the height position of the pattern by the solidified body formed of only the excessive amount of sublimable substance settled, and as compared with a case where the pattern-formed surface is covered by the solidified body formed of the substrate treating liquid containing the solvent, it is possible to minimize the influence of a surface tension exerted on the pattern in the sublimation step. Consequently, it is possible to reduce the occurrence of collapse of the pattern as in a case where as the substrate treating liquid, a liquid is used which is formed of only the sublimable substance or beyond the case. Moreover, it is possible to significantly reduce the amount of sublimable substance used as compared with a conventional substrate treating liquid. Furthermore, the amount of sublimable substance used is reduced, and thus it is possible to reduce the amount of residue such as particles derived from the sublimable substance in the pattern-formed surface after the sublimation step.

Here, the "molten state" means that the sublimable substance melts fully or partially and thereby has fluidity so as to be brought into a liquid state. The "sublimable" means that a single substance, a compound or a mixture has the property of changing its phase from a solid phase to a gas phase or from a gas phase to a solid phase without the intervention of a liquid phase, and the "sublimable substance" means a substance which has the sublimable property described above. The "pattern-formed surface" means a surface of a substrate in which a concave/convex pattern is formed in an arbitrary region regardless of the surface being planar, curved or concave/convex. The "solidified body" is a body obtained by the solidification of a liquid.

In this configuration, it is preferred that in the solidification step, the excessive amount of the sublimable substance settled is solidified, and thereafter a liquid layer part in which the sublimable substance is saturated is further solidified so as to form the solidified body, and in the sublimation step, the liquid layer part solidified in the solidification step is sublimed, and thereafter the solidified sublimable substance is sublimed. The liquid layer part in which the sublimable substance is saturated means part other than the liquid layer obtained by settling the excessive amount of sublimable substance in the liquid film formed of the substrate treating liquid supplied to the pattern-formed surface. In the configuration described above, the liquid layer part is also solidified after the solidification of the settled sublimable substance. Furthermore, in the sublimation step, the solidified liquid layer part is first sublimed, and thereafter the solidified part of the settled sublimable substance is sublimed. In other words, in the configuration described above, the liquid layer part in which the sublimable substance is saturated can be removed from the substrate by freeze drying, and thus it is possible to more reduce the occurrence of collapse of the pattern.

In this configuration, it is preferred that in the supply step, the substrate treating liquid is supplied to the pattern-formed surface of the substrate under atmospheric pressure, and in the solidification step, the substrate treating liquid is cooled under the atmospheric pressure to a temperature equal to or less than the freezing points of the sublimable substance and the solvent. In this way, in at least the supply step and the solidification step, it is not necessary to use constituent components having pressure resistance, and thus it is possible to reduce the cost of the apparatus used in the substrate treating method.

In this configuration, it is preferred that in the supply step, before the substrate treating liquid is supplied to the pattern-formed surface, a temperature of the substrate treating liquid is adjusted to be equal to or more than melting points of the sublimable substance and the solvent and less than boiling points thereof. The temperature of the substrate treating liquid is adjusted to be equal to or more than the melting point of the sublimable substance and less than the boiling point thereof, and thus the sublimable substance in the molten state can be present in the substrate treating liquid. The temperature adjustment of the substrate treating liquid is performed within the temperature range described above, and thus it is possible to control the solubility of the sublimable substance in the solvent. Consequently, when the solubility of the sublimable substance in the solvent is lowered, it is also possible to adjust the excessive amount of sublimable substance which is settled in the liquid film.

In this configuration, it is preferred that in the supply step, before the substrate treating liquid is supplied to the pattern-formed surface, the sublimable substance settled in the substrate treating liquid is removed from the substrate treating liquid. In this way, the amount of sublimable substance which is so excessive as to be separated can be prevented from being supplied simultaneously when the substrate treating liquid is supplied to the pattern-formed surface. Consequently, the amount of sublimable substance used in the treating of the substrate is optimized.

In this configuration, it is preferred that the sublimable substance is sublimable under the atmospheric pressure, and in the sublimation step, the sublimable substance is sublimed under the atmospheric pressure. In this way, in at least the sublimation step, it is not necessary to use constituent components having pressure resistance, and thus it is possible to reduce the cost of the apparatus used in the substrate treating method.

In this configuration, it is preferred that in at least one of the solidification step and the sublimation step, a coolant is supplied toward a back surface on a side opposite to the pattern-formed surface of the substrate at a temperature equal to or less than the freezing points of the sublimable substance and the solvent.

In the configuration described above, in the solidification step, the coolant whose temperature is equal to or less than the freezing points of the sublimable substance and the solvent is supplied toward the back surface on the side opposite to the pattern-formed surface, and thus it is easy to first start the solidification of the excessive amount of sublimable substance which is settled in the liquid film. In the sublimation step, the coolant is supplied toward the back surface of the substrate, and thus the solidified body can be naturally sublimed while the solidified part of the excessive amount of sublimable substance which is settled is being prevented from being melted.

In this configuration, in at least one of the solidification step and the sublimation step, an inert gas which is inert to at least the sublimable substance and the solvent may be supplied toward the pattern-formed surface at a temperature equal to or less than the freezing points of the sublimable substance and the solvent.

In the configuration described above, in the solidification step, the inert gas whose temperature is equal to or less than the freezing points of the sublimable substance and the solvent is supplied toward the pattern-formed surface, and thus the sublimable substance and the solvent can be cooled so as to be solidified. In the sublimation step, the inert gas is also supplied to the solidified body of the substrate treating liquid formed on the pattern-formed surface, and thus the solidified body can be sublimed. The inert gas is inert to the sublimable substance and the solvent, and thus the sublimable substance and the solvent do not denature.

In this configuration, in the sublimation step, an inert gas which is inert to at least the sublimable substance and the solvent may be supplied toward the pattern-formed surface at a temperature equal to or less than the freezing points of the sublimable substance and the solvent, and a coolant mat be supplied toward a back surface on a side opposite to the pattern-formed surface of the substrate at the temperature equal to or less than the freezing points of the sublimable substance and the solvent.

In the configuration described above, the inert gas whose temperature is equal to or less than the freezing points of the sublimable substance and the solvent is supplied to the solidified body of the substrate treating liquid formed on the pattern-formed surface, and thus the solidified body of the substrate treating liquid can be sublimed. The coolant whose temperature is equal to or less than the freezing points of the sublimable substance and the solvent is supplied toward the back surface on the side opposite to the pattern-formed surface, and thus the solidified body can be sublimed while being prevented from being melted. The inert gas is inert to the sublimable substance and the solvent, and thus the sublimable substance and the solvent do not denature.

In this configuration, in the sublimating step, the pattern-formed surface on which the solidified body is formed is reduced in pressure to an environment lower than atmospheric pressure.

In the sublimation step, the pressure of the pattern-formed surface is reduced to a pressure which is lower than the atmospheric pressure, and thus the solidified body can be sublimed. Here, when the sublimable substance is sublimed from the solidified body so as to be vaporized, heat is removed from the solidified body by sublimation heat and thereby the solidified body is cooled. Hence, for example, even in a temperature environment slightly higher than the melting point of the sublimable substance, the solidified body can be maintained to have a temperature lower than the melting of the sublimable substance without being cooled separately. Consequently, the solidified body can be sublimed while the sublimable substance in the solidified body is being prevented from being melted.

In this configuration, it is preferred that the sublimable substance is fluorinated carbon compound.

In this configuration, it is preferred that the fluorinated carbon compound is at least one selected from the group consisting of the following compounds (A) to (E):

a compound (A): a fluoroalkane having 3 to 6 carbon atoms, or the fluoroalkane to which at least one selected from the group consisting of the following is bonded: halogen groups except a fluoro group, a hydroxyl group, an oxygen atom, a carboxyl group, and perfluoroalkyl groups;

a compound (B): a fluorocycloalkane having 3 to 6 carbon atoms, or the fluorocycloalkane to which at least one selected from the group consisting of the following is bonded: halogen groups except a fluoro group, a hydroxyl group, an oxygen atom, a carboxyl group, and perfluoroalkyl groups;

a compound (C): a fluorobicycloalkane having 10 carbon atoms, or the fluorobicycloalkane to which at least one selected from the group consisting of the following is bonded: halogen groups except a fluoro group, cycloalkyl groups which may each have a halogen atom, and alkyl groups each having a cycloalkyl group which may have a halogen atom;

a compound (D): a fluorotetracyanoquniodimethane, or the fluorotetracyanoquniodimethane to which at least one halogen radical except a fluoro group is bonded; and a compound (E): a fluorocyclotriphosphazene, or the fluorocyclotriphosphazene to which at least one selected from the group consisting of the following is bonded: halogen groups except a fluoro group, a phenoxy group, and alkoxy groups.

In order to solve the above-mentioned problems, the substrate treating liquid which includes a sublimable substance in a molten state and a solvent, wherein a freezing point of the sublimable substance is higher than a freezing point of the substrate treating liquid, and when solubility of the sublimable substance in the solvent is lowered, an excessive amount of the sublimable substance whose density is higher than a density of the substrate treating liquid is settled.

For example, the substrate treating liquid in the configuration described above can be used for removing liquids present on the pattern-formed surface of the substrate by the principle of freeze drying (or sublimation drying). Since the substrate treating liquid in the configuration described above contains the sublimable substance and the solvent, and the sublimable substance is higher in density than the substrate treating liquid, when the solubility of the sublimable substance in the solvent is lowered, the excessive amount of sublimable substance can be settled. Since the sublimable substance is higher in freezing point than the substrate treating liquid, when the substrate treating liquid is solidified on the pattern-formed surface, the solidified body of the excessive amount of sublimable substance settled can be formed such that the pattern is covered by only the solidified body of the excessive amount of sublimable substance settled. Hence, in the substrate treating liquid in the configuration described above, the amount of sublimable substance contained can be reduced such that the collapse of the pattern is prevented from occurring, and thus it is possible to reduce the amount of sublimable substance used as compared with the conventional substrate treating liquid. The amount of sublimable substance used is reduced, and thus after the sublimable substance is used, it is possible to reduce a residue such as particles derived from the sublimable substance.

In this configuration, it is preferred that the sublimable substance is fluorinated carbon compound.

In this configuration, it is preferred that the fluorinated carbon compound is at least one selected from the group consisting of the following compounds (A) to (E):

a compound (A): a fluoroalkane having 3 to 6 carbon atoms, or the fluoroalkane to which at least one selected from the group consisting of the following is bonded: halogen groups except a fluoro group, a hydroxyl group, an oxygen atom, a carboxyl group, and perfluoroalkyl groups;

a compound (B): a fluorocycloalkane having 3 to 6 carbon atoms, or the fluorocycloalkane to which at least one selected from the group consisting of the following is bonded: halogen groups except a fluoro group, a hydroxyl group, an oxygen atom, a carboxyl group, and perfluoroalkyl groups;

a compound (C): a fluorobicycloalkane having 10 carbon atoms, or the fluorobicycloalkane to which at least one selected from the group consisting of the following is bonded: halogen groups except a fluoro group, cycloalkyl groups which may each have a halogen atom, and alkyl groups each having a cycloalkyl group which may have a halogen atom;

a compound (D): a fluorotetracyanoquniodimethane, or the fluorotetracyanoquniodimethane to which at least one halogen radical except a fluoro group is bonded; and a compound (E): a fluorocyclotriphosphazene, or the fluorocyclotriphosphazene to which at least one selected from the group consisting of the following is bonded: halogen groups except a fluoro group, a phenoxy group, and alkoxy groups.

In order to solve the above-mentioned problems, the substrate treating apparatus which is used in the substrate treating method, the substrate treating apparatus comprises a supplying unit adapted for supplying the substrate treating liquid to the pattern-formed surface of the substrate, a solidifying unit adapted for solidifying the substrate treating liquid on the formed surface so as to form the solidified body and a sublimating unit adapted for subliming the solidified body so as to remove the solidified body from the formed surface, wherein the supplying unit includes a separation part which removes, from the substrate treating liquid, the sublimable substance separated in the substrate treating liquid, and the substrate treating liquid which is supplied to the pattern-formed surface of the substrate is a substrate treating liquid in which the separated sublimable substance has been removed with the separation part.

In the configuration described above, the supplying unit which supplies the substrate treating liquid to the pattern-formed surface includes the separation part described above, and thus before the supply thereof, the excessive amount of sublimable substance can be previously removed from the substrate treating liquid. In this way, the amount of sublimable substance which is so excessive as to be separated is prevented from being supplied simultaneously with the substrate treating liquid on the pattern-formed surface, and thus the amount of sublimable substance used in the treating of the substrate is optimized.

Advantageous Effects of Invention

The present invention uses the means described above so as to produce effects which will be described below.

Specifically, in the substrate treating method of the present invention, when the substrate treating liquid which contains the sublimable substance in the molten state and the solvent and which is supplied to the pattern-formed surface of the substrate is solidified, the solubility of the sublimable substance in the solvent is first lowered, and thus the excessive amount of sublimable substance is settled. Thereafter, the substrate treating liquid is solidified such that the pattern-formed surface is covered up to at least the height position of the pattern by only the solidified body formed of the excessive amount of sublimable substance settled. In this way, in the substrate treating method of the present invention, the amount of sublimable substance contained can be reduced while the occurrence of collapse of the pattern is being reduced. In other words, in the present invention, as compared with the conventional method, it is possible to reduce the amount of sublimable substance used while maintaining the amount of substrate treating liquid, and it is also possible to satisfactorily reduce the occurrence of collapse of the pattern.

The substrate treating liquid of the present invention contains the sublimable substance in the molten state and the solvent, and the sublimable substance is higher in freezing point than the substrate treating liquid, and furthermore, when the solubility of the sublimable substance in the solvent is lowered, the excessive amount of sublimable substance whose density is higher than that of the substrate treating liquid is settled. Hence, the substrate treating liquid of the present invention is used in the substrate treating method as described above, and thus it is possible to realize a reduction in the collapse of the pattern while reducing the amount of sublimable substance used.

Furthermore, since the substrate treating apparatus of the present invention includes the separation part which removes, from the substrate treating liquid, the sublimable substance separated in the substrate treating liquid, when the substrate treating apparatus is used in the substrate treating method as described above, the excessive amount of sublimable substance is previously removed from the substrate treating liquid, and then the substrate treating liquid can be supplied to the pattern-formed surface of the substrate.

Consequently, the amount of sublimable substance used in the treating of the substrate can be more optimized.

DESCRIPTION OF EMBODIMENTS

First Embodiment

<1-1 Substrate Treating Apparatus>

Figure 1:
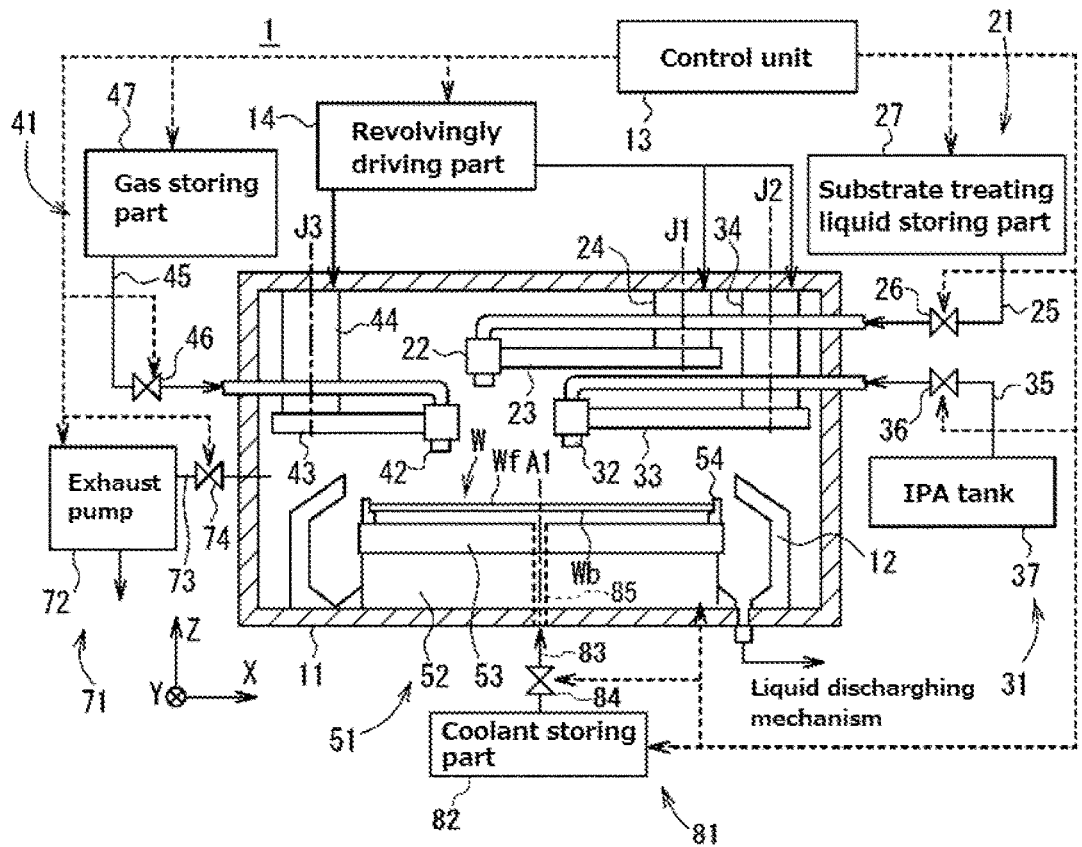
FIG. 1 is an illustrative diagram schematically showing a substrate treating apparatus according to a first embodiment of the present invention.
Figure 2:
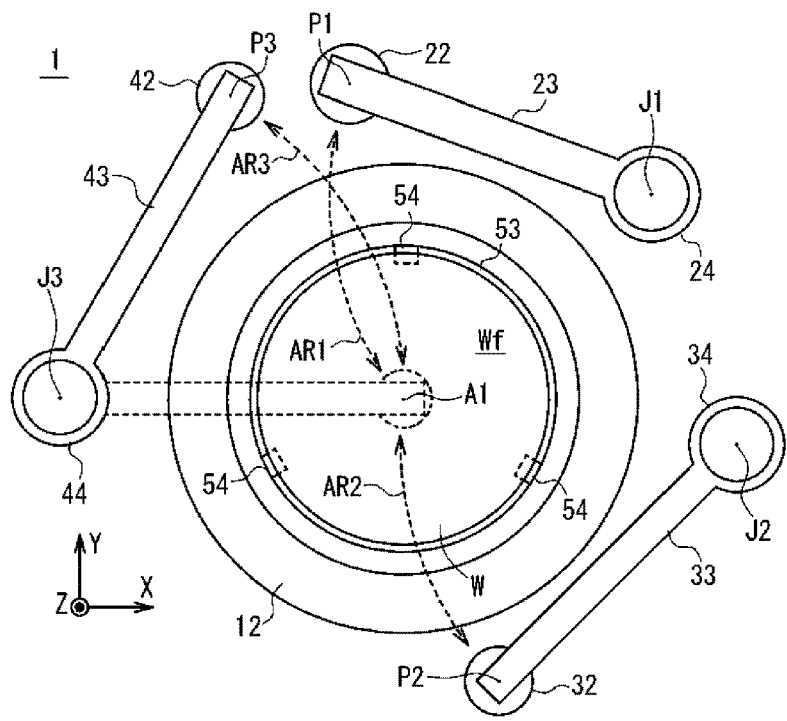
FIG. 2 is a schematic plan view showing the substrate treating apparatus.

FIG. 1 is an illustrative diagram schematically showing a substrate treating apparatus 1 according to the present embodiment. FIG. 2 is a schematic plan view showing the substrate treating apparatus 1. In individual figures, in order to clarify the relationship of directions shown in the figures, XYZ orthogonal coordinate axes are shown as necessary. In FIGS. 1 and 2, an XY plane indicates a horizontal plane, and a +Z direction indicates a vertically upward direction.

A substrate treating apparatus 1 can be used, for example, for treating on various types of substrates. The "substrates" described above refer to various types of substrates such as a semiconductor substrate, a substrate for a photomask glass, a substrate for a liquid crystal display glass, a substrate for a plasma display glass, a FED (Field Emission Display) substrate, a substrate for an optical disc, a substrate for a magnetic disc and a substrate for a magneto-optical disc. In the present embodiment, a description will be given using, as an example, a case where the substrate treating apparatus 1 is used for treating on a semiconductor substrate (hereinafter referred to as a "substrate W").

A substrate W is considered here, as an example of the substrate, in which a circuit pattern and the like (hereinafter referred to as a "pattern") are formed on only one main surface. Here, a surface on which the pattern is formed is referred to as a "pattern-formed surface" or a "front surface", and a main surface on the opposite side on which the pattern is not formed is referred to as a "back surface". The surface of the substrate which is directed downward is referred to as a "lower surface", and the surface of the substrate which is directed upward is referred to as an "upper surface". A description will be given below with the assumption that the upper surface is the front surface.

The substrate treating apparatus 1 is a single-wafer type substrate treating apparatus which is used in washing treatment (including rinsing treatment) for removing contaminants such as particles adhered to the substrate W and drying treatment after the washing treatment. Although in FIGS. 1 and 2, only portions used in the dry processing are shown, and a nozzle and the like for washing used in the washing processing are not shown, the substrate treating apparatus 1 may include the nozzle and the like.

The configuration of the substrate treating apparatus 1 will be described with reference to FIGS. 1 and 2.

The substrate treating apparatus 1 includes at least a chamber 11 which is a container for storing the substrate W, a substrate holding unit 51 which holds the substrate W, a control unit 13 which controls the individual portions of the substrate treating apparatus 1, a substrate treating liquid supplying unit (supplying unit) 21 which supplies a substrate treating liquid to the substrate W held in the substrate holding unit 51, an IPA supplying unit 31 which supplies IPA (isopropyl alcohol) to the substrate W held in the substrate holding unit 51, a gas supplying unit (solidifying unit, sublimating unit) 41 which supplies a gas to the substrate W held in the substrate holding unit 51, a scattering prevention cup 12 which collects the IPA, the substrate treating liquid and the like that are supplied to the substrate W held in the substrate holding unit 51 and that are discharged to the outside of the circumferential edge portion of the substrate W, a revolvingly driving part 14 which individually and independently turns and drives arms to be described later in the individual portions of the substrate treating apparatus 1 and a pressure reduction unit 71 which reduces the pressure within the chamber 11. The substrate treating apparatus 1 also includes a substrate loading/unloading unit, a chuck pin opening/closing mechanism and a wet washing unit (all of which are not illustrated). The individual portions of the substrate treating apparatus 1 will be described below.

The substrate holding unit 51 includes a rotation drive portion 52, a spin base 53 and chuck pins 54. The spin base 53 has a planar size slightly larger than the substrate W. In the vicinity of the circumferential edge portion of the spin base 53, a plurality of chuck pins 54 which grasp the circumferential edge portion of the substrate W are provided so as to stand. Although the number of chuck pins 54 installed is not particularly limited, at least three or more chuck pins 54 are preferably provided in order to reliably hold the circular substrate W. In the first embodiment, along the circumferential edge portion of the spin base 53, three chuck pins 54 are arranged at equal intervals (see FIG. 2). Each of the chuck pins 54 includes a substrate support pin which supports the circumferential edge portion of the substrate W from below and a substrate holding pin which presses the outer circumferential end surface of the substrate W supported by the substrate support pin so as to hold the substrate W.

Each of the chuck pins 54 can be switched between a pressed state where the substrate hold pin presses the outer circumferential end surface of the substrate W and a released state where the substrate hold pin is separated from the outer circumferential end surface of the substrate W, and the switching of the states is performed according to an operation instruction from the control unit 13 which controls the entire apparatus.

More specifically, when the substrate W is loaded or unloaded with respect to the spin base 53, the individual chuck pins 54 are brought into the released state whereas when substrate treating to be described later from the washing treatment to the removal treatment is performed on the substrate W, the individual chuck pins 54 are brought into the pressed state. When the chuck pin 54 is brought into the pressed state, the chuck pin 54 grasps the peripheral portion of the substrate W such that the substrate W is held in a horizontal posture (XY plane) a predetermined distance apart from the spin base 53. In this way, the substrate W is held horizontally in a state where its front surface Wf is directed upward.

Although as described above, in the first embodiment, the substrate W is held by the spin base 53 and the chuck pins 54, the substrate holding method is not limited to this method. For example, the back surface Wb of the substrate W may be held by an adsorption method with a spin chuck or the like.

The spin base 53 is coupled to the rotation drive portion 52. The rotation drive portion 52 is rotated about an axis A1 along the Z direction by the operation instruction of the control unit 13. The rotation drive portion 52 is formed with a belt, a motor and a rotation shaft which are known. The rotation drive portion 52 is rotated about the axis A1, and thus the substrate W held by the chuck pins 54 above the spin base 53 is rotated about the axis A1 together with the spin base 53.

The substrate treating liquid supplying unit 21 will then be described.

The substrate treating liquid supplying unit 21 is a unit which supplies the substrate treating liquid (the details of which will be described later) to the pattern-formed surface of the substrate W, and includes, as shown in FIG. 1, at least a nozzle 22, an arm 23, a turning shaft 24, a pipe 25, a valve 26 and a substrate treating liquid storing part 27.

Figure 3A:
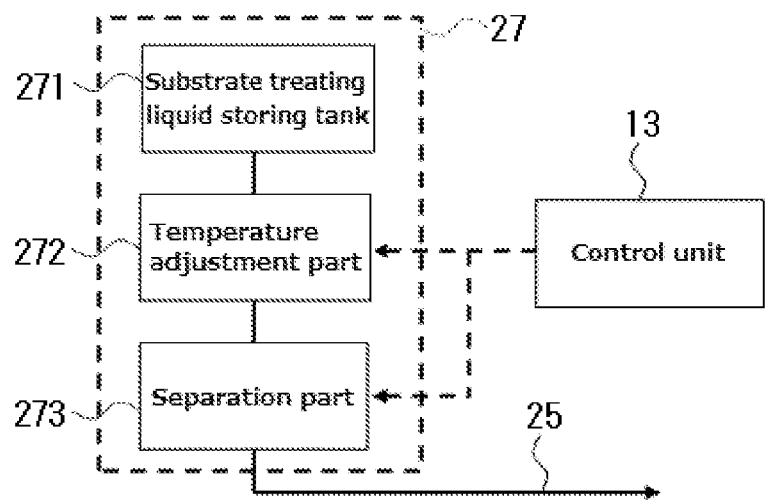
FIG. 3($a$) is a block diagram showing a schematic configuration of a substrate treating liquid storing part in the substrate treating apparatus, and FIG. 3($b$) is an illustrative diagram showing a specific configuration of the substrate treating liquid storing part.
Figure 3B:
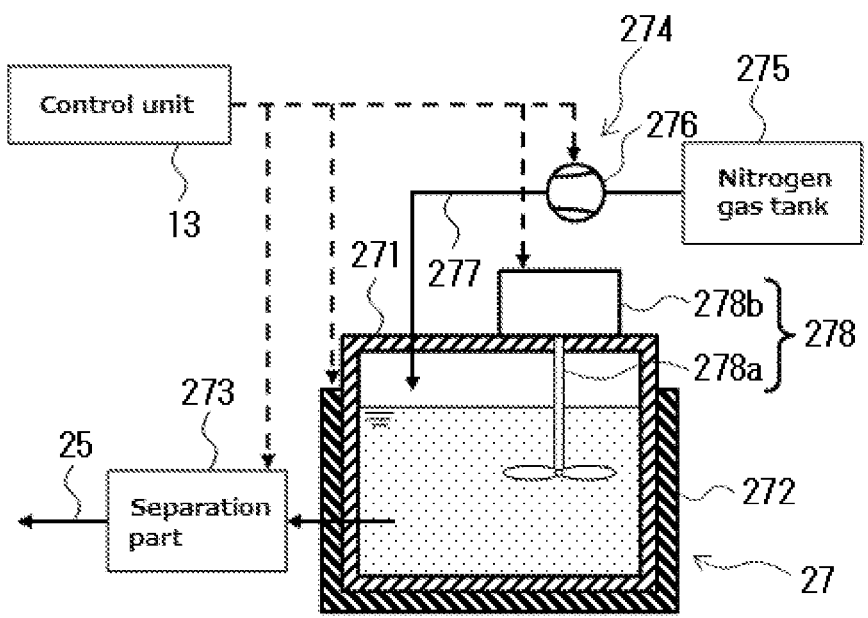

As shown in FIGS. 4(a) and 4(b), the substrate treating liquid storing part 27 includes at least a substrate treating liquid storage tank 271, an agitation part 277 which agitates the substrate treating liquid within the substrate treating liquid storage tank 271, a pressurization part 275 which pressurizes the substrate treating liquid storage tank 271 so as to feed out the substrate treating liquid, a temperature adjusting part 272 which heats the substrate treating liquid within the substrate treating liquid storage tank 271 and a separation part 273 which removes a sublimable substance separated within the substrate treating liquid before the substrate treating liquid is supplied to the pattern-formed surface of the substrate. FIG. 3(a) is a block diagram showing a schematic configuration of the substrate treating liquid storing part 27, and FIG. 3(b) is an illustrative diagram showing a specific configuration of the substrate treating liquid storing part 27.

The agitation part 277 includes a rotation part 278a which agitates the substrate treating liquid within the substrate treating liquid storage tank 271 and an agitation control part 278b which controls the rotation of the rotation part 278a. The agitation control part 278b is electrically connected to the control unit 13. The rotation part 278a has a propeller-shaped agitation blade at a tip end of the rotation shaft (the lower end of the rotation part 279 in FIG. 5), the control unit 13 provides an operation instruction to the agitation control part 278 such that the rotation part 279 is rotated, and thus the substrate treating liquid is agitated by the agitation blade, with the result that the concentration and temperature of the sublimable substance and the like in the substrate treating liquid are made uniform.

The method of making the concentration and temperature of the substrate treating liquid within the substrate treating liquid storing tank 271 uniform is not limited to the method described above, and a known method such as a method of additionally providing a circulation pump to circulate the substrate treating liquid can be used.

The pressurization part 274 is formed with a nitrogen gas tank 275 which is the supply source of a gas for pressurizing the interior of the substrate treating liquid storing tank 271, a pump 276 which pressurizes nitrogen gas and a pipe 277. The nitrogen gas tank 275 is connected through the pipe 277 with the pipeline to the substrate treating liquid storing tank 271, and the pump 276 is interposed in the pipe 277. The pump 276 is electrically connected to the control unit 13. The pump 276 supplies, by an operation instruction of the control unit 13, the nitrogen gas stored in the nitrogen gas tank 275 through the pipe 277 to the substrate treating liquid storage tank 271 so as to adjust the pressure within the substrate treating liquid storage tank 271. The control of the pump 276 by the control unit 13 is performed based on a detection value of a pressure sensor (unillustrated) which is provided within the substrate treating liquid storage tank 271 and which is electrically connected to the control unit 13. In this way, the pressure within the substrate treating liquid storage tank 271 can be maintained to be a predetermined pressure which is higher than atmospheric pressure.

Although in the first embodiment, the nitrogen gas is used so as to pressurize the interior of the substrate treating liquid storage tank 271, in the practice of the present invention, there is no limitation to the nitrogen gas as long as a gas inert to the sublimable substance and the solvent is used. Specific examples of the gas inert to the sublimable substance and the solvent include helium gas, neon gas, argon gas, air (mixed gas of 80% of nitrogen gas by volume and 20% of oxygen gas by volume) and the like. Alternatively, the inert gas may be a mixed gas obtained by mixing a plurality of types of gases among these gases.

The temperature adjusting part 272 is electrically connected to the control unit 13, and heats, by the operation instruction of the control unit 13, the substrate treating liquid stored in the substrate treating liquid storage tank 271 so as to perform temperature adjustment. The temperature adjustment is preferably performed such that the temperature of the substrate treating liquid is equal to or more than the melting points of the sublimable substance and the solvent contained in the substrate treating liquid. In this way, it is possible to maintain the molten state of the substrate treating liquid. The upper limit of the temperature adjustment is preferably a temperature which is lower than the boiling points of the sublimable substance and the solvent. The temperature adjusting part 272 is not particularly limited, and for example, a known temperature adjustment mechanism can be used such as a resistance heater, a Peltier element or a pipe through which water whose temperature is adjusted is passed. In the present embodiment, the configuration of the temperature adjusting part 272 is arbitrary. For example, when an environment in which the substrate treating apparatus 1 is installed is an environment whose temperature is higher than the melting point of the sublimable substance, since it is possible to maintain the liquid state of the substrate treating liquid without performing the temperature adjustment, it is not necessary to heat the substrate treating liquid with the temperature adjusting part 272. Consequently, the temperature adjusting part 272 can be omitted.

As shown in FIGS. 3(a) and 3(b), the separation part 273 is electrically connected to the control unit 13, and removes, by the operation instruction of the control unit 13, an amount of sublimable substance which is excessive within the substrate treating liquid so as to be separated. In this way, in the present embodiment, it is possible to prevent the excessive amount of separated sublimable substance from being supplied to the pattern-formed surface of the substrate W together with the substrate treating liquid. The excessive amount of sublimable substance removed may be supplied again to the substrate treating liquid storage tank 271 such that it is reused as the sublimable substance contained in the substrate treating liquid. Although in FIG. 3(b), the separation part 273 is installed outside the substrate treating liquid storage tank 271, in the present embodiment, there is no limitation to this configuration. For example, the separation part 273 may be installed within the substrate treating liquid storage tank 271.

As long as the separation part 273 can remove the sublimable substance separated in the substrate treating liquid, the separation part 273 is not particularly limited, and a known separation part can be used. Specific examples thereof include a liquid phase extraction device using centrifugation.

With reference back to FIG. 1, the substrate treating liquid storing part 27 (more specifically, the substrate treating liquid storage tank 271) is connected through the pipe 25 with the pipeline to the nozzle 22, and the valve 26 is interposed partway through the path of the pipe 25.

The valve 26 is electrically connected to the control unit 13, and is normally closed. The opening and closing of the valve 26 is also controlled by the operation instruction of the control unit 13. When the control unit 13 provides the operation instruction to the substrate treating liquid supplying unit 21 so as to open the valve 26, the substrate treating liquid is fed by pressure from the interior of the substrate treating liquid storage tank 271 which is pressurized, and is discharged through the pipe 25 from the nozzle 22. In this way, it is possible to supply the substrate treating liquid to the front surface Wf of the substrate W. Since the substrate treating liquid storage tank 271 uses, as described above, the pressure caused by the nitrogen gas so as to feed the substrate treating liquid, the substrate treating liquid storage tank 271 is preferably configured so as to be airtight.

The nozzle 22 is attached to the tip end portion of the arm 23 which is provided so as to be extended horizontally, and is arranged above the spin base 53. The back end portion of the arm 23 is supported by the turning shaft 24 provided so as to be extended in the Z direction such that back end portion of the arm 23 is freely rotated about an axis J1, and the turning shaft 24 is provided so as to be fixed within the chamber 11. The arm 23 is coupled through the turning shaft 24 to the revolvingly driving part 14. The revolvingly driving part 14 is electrically connected to the control unit 13, and turns the arm 23 about the axis J1 by the operation instruction from the control unit 13. As the arm 23 is turned, the nozzle 22 is moved.

As indicated by solid lines in FIG. 2, the nozzle 22 is normally located outside the peripheral portion of the substrate W, and is arranged in a retraction position P1 outside the scattering prevention cup 12. When the arm 23 is turned by the operation instruction of the control unit 13, the nozzle 22 is moved along the path of an arrow AR1 so as to be arranged in a position above the center portion (the axis A1 or the vicinity thereof) of the front surface Wf of the substrate W.

Returning to FIG. 1, the following will describe the IPA supplying unit 31. The IPA supplying unit 31 is a unit for supplying IPA to the substrate W, and has a nozzle 32, an arm 33, a revolving axis 34, a pipe 35, a valve 36 and an IPA tank 37.

The IPA tank 37 is connected through the pipe 35 to the nozzle 32. The valve 36 is fitted into the middle of the path of the pipe 35. In the IPA tank 37, IPA is stored. A first pressurization unit not illustrated pressurizes IPA inside the IPA tank 37 to send IPA from the pipe 35 into the direction of the nozzle 32. Since the first pressurization unit can be realized by pressurization with a pump or the like or by compressing and storing a gas into the IPA tank 37, any pressurization unit may be used.

The valve 36 is electrically connected to the control unit 13, and is usually closed. The opening and closing of the valve 36 are each controlled through an operation command from the control unit 13. When the valve 36 is opened through an operation command from the control unit 13, IPA is passed through the pipe 35 to be supplied to the front surface Wf of the substrate W from the nozzle 32.

The nozzle 32 is fitted to a front tip of the arm 33 extended horizontally, and is located over the spin base 53. A rear tip of the arm 33 is freely rotatably supported around an axis J2 by the revolving axis 34 extended in the Z direction. The revolving axis 34 is located to be fixed inside the chamber 11. The arm 33 is connected through the revolving axis 34 to the revolvingly driving part 14. The revolvingly driving part 14 is electrically connected to the control unit 13, and moves the arm 33 revolvingly around the axis J2 through an operation command from the control unit 13. With the revolving movement of the arm 33, the nozzle 32 is also shifted.

As represented by a solid line in FIG. 2, the nozzle 32 is usually located at a retiring position P2 outside the peripheral portion of the substrate W and outside the scattering-preventing cup 12. When the arm 33 is revolvingly moved through an operation command from the control unit 13, the nozzle 32 is shifted along a path represented by an arrow AR2 to be arranged at a position over the central portion of the front surface Wf of the substrate W (over the position of the axis A1 or the vicinity thereof).

Although in the first embodiment, in the IPA supplying unit 31, IPA is used. In the present disclosure, however, the liquid used in this supplying unit is not limited to IPA as far as the liquid is soluble in the sublimable substance, the solvent and deionized water (DIW). Examples of an alternate for IPA in the present embodiment include methanol, ethanol, acetone, benzene, carbon tetrachloride, chloroform, hexane, decalin, tetralin, acetic acid, cyclohexanol, ether, and hydrofluoro ether.

With reference back to FIG. 1, the gas supplying unit 41 will then be described. The gas supplying unit 41 is a unit which supplies a gas to the substrate W, and includes a nozzle 42, an arm 43, a turning shaft 44, a pipe 45, a valve 46 and a gas storing part 47. The gas supplying unit 41 is used for solidifying the substrate treating liquid supplied to the substrate W so as to form a solidified body of the substrate treating liquid or subliming the solidified body (the details of which will be described later).

Figure 4:
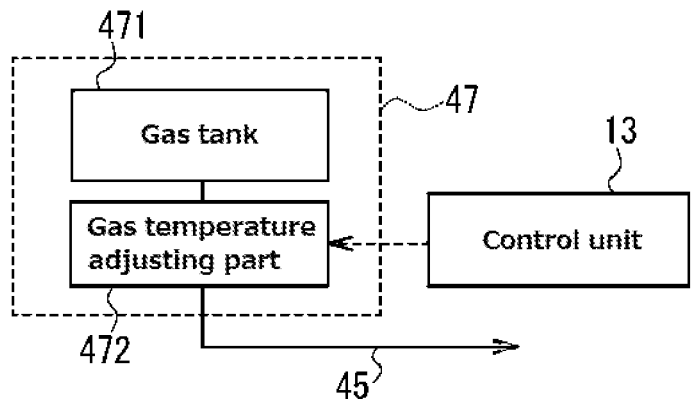
FIG. 4 is a block diagram showing a schematic configuration of a gas supplying unit in the substrate treating apparatus.

FIG. 4 is a block chart illustrating a schematic structure of the gas storing part 47. The gas storing part 47 has a gas tank 471 in which a gas is stored, and a gas temperature adjusting part 472 for adjusting the temperature of the gas stored in the gas tank 471. The gas temperature adjusting part 472 is electrically connected to the control unit 13, and is a section for heating or cooling the gas stored in the gas tank 471 through an operation command from the control unit 13 so as to adjust the temperature of the gas. It is sufficient for the temperature adjustment to be made to adjust the temperature of the gas stored in the gas storing part 471 to a low temperature not higher than the solidifying point of the dry assistant substance. The supply source of the gas may be utility facilities provided within a factory or the like.

The gas temperature adjusting part 472 is not particularly limited, and may be a known gas temperature adjusting mechanism such as a Peltier element or a pipe through temperature-adjusted water is passed.

Returning to FIG. 1, the gas storing part 47 (more specifically, the gas tank 471) is connected through the pipe 45 to the nozzle 42. The valve 46 is fitted into the middle of the path of the pipe 45. A pressurizing unit not illustrated pressurizes the gas in the gas tank 47 to send the gas to the pipe 45. The second pressurizing unit can be realized by pressurization through, e.g., a pump, or by compressing and storing the gas into the gas tank 47. Thus, the pressurizing unit may be any pressurizing unit.

The valve 46 is electrically connected to the control unit 13, and is usually closed. The opening and closing of the valve 46 are each controlled through an operation command from the control unit 13. When the valve 46 is opened through an operation command from the control unit 13, the gas is passed through the pipe 45 to be supplied from the nozzle 42 to the front surface Wf of the substrate W.

The nozzle 42 is fitted to a front tip of the arm 43 extended horizontally, and is located over the spin base 53. A rear tip of the arm 43 is freely rotatably supported around an axis J3 by the revolving axis 44 extended in the Z direction. The revolving axis 44 is located to be fixed inside the chamber 11. The arm 43 is connected through the revolving axis 44 to the revolvingly driving part 14. The revolvingly driving part 14 is electrically connected to the control unit 13, and moves the arm 43 revolvingly around the axis J3 through an operation command from the control unit 13. With the revolving movement of the arm 43, the nozzle 42 is also shifted.

As represented by a solid line in FIG. 2, the nozzle 42 is usually located at a retiring position P3 outside the peripheral portion of the substrate W and outside the scattering-preventing cup 12. When the arm 43 is revolvingly moved through an operation command from the control unit 13, the nozzle 42 is shifted along a path represented by an arrow AR3 to be arranged at a position over the central portion of the front surface Wf of the substrate W (over the position of the axis A1 or the vicinity thereof). In FIG. 2, a dotted line represents a situation that the nozzle 42 is arranged above the central portion of the front surface Wf.

In the gas tank 471, an inert gas is stored, which is chemically inert to at least the sublimable substance and the solvent. More specifically, nitrogen gas is stored therein. In the gas temperature adjusting part 472, the stored nitrogen gas is adjusted into a temperature not higher than the solidifying point of the dry assistant substance. The nitrogen gas temperature is not particularly limited as far as the temperature is a temperature not higher than the solidifying point of the dry assistant substance. The temperature is usually set into a range from 0 to 15° C. both inclusive. When the nitrogen gas temperature is set to 0° C. or higher, the following can be prevented: water vapor present inside the chamber 11 is solidified to cause, for example, the adhesion of the resultant on the front surface Wf of the substrate W; and thus bad effects are produced on the substrate W.

The nitrogen gas used in the first embodiment is preferably a dry gas having a dew point of 0° C. or lower. When the nitrogen gas is blown to the solidified body, in an atmospheric-pressure environment, the sublimable substance in the solidified sublimates into the nitrogen gas. Since the nitrogen gas is continuously supplied to the solidified body, the partial pressure of the gas-state dry assistant substance generated by the sublimation in the nitrogen gas is kept lower than the saturated vapor pressure of the gas-state dry assistant substance at the temperature of the nitrogen gas. Thus, at least the surface of the solidified body, is filled with the gas-state dry assistant substance in an atmosphere in which this substance is present at the saturated vapor pressure or less.

In the first embodiment, the gas supplied by the gas supplying unit 41 is nitrogen gas. In the present disclosure, however, the supplied gas is not particularly limited to this gas as far as the gas is a gas inert to the sublimable substance and the solvent. In the first embodiment, examples of a gas alternative for the nitrogen gas include argon gas, helium gas, and air (gas composed of nitrogen gas in a concentration of 80% and oxygen gas in a concentration of 20%). Alternatively, the alternative gas may be a mixed gas in which two or more of these gases are mixed with each other.

Returning to FIG. 1, the pressure reducing unit 71 is a unit for reducing the pressure inside the chamber 11 to render the inside of the chamber 11 an environment having a pressure lower than any atmospheric pressure, and has an exhaust pump 72, a pipe 73, and a valve 74. The exhaust pump 72 is a known pump which is connected through the pipe 73 to the chamber 11 to apply pressure to a gas. The exhaust pump 72 is electrically connected to the control unit 13, and is usually in a stop state. The driving of the exhaust pump 72 is controlled through an operation command from the control unit 13. Moreover, the valve 74 is fitted into the middle of the pipe 73. The valve 74 is electrically connected to the control unit 13, and is usually closed. The opening and closing of the valve 74 are each controlled through an operation command from the control unit 13.

Through an operation command from the control unit 13 the exhaust pump 72 is driven and the valve 74 is opened, and then the gas present inside the chamber 11 is discharged through the pipe 73 to the outside of the chamber 11 by the exhaust pump 72.

The scattering-preventing cup 12 is located to surround the spin base 53. The scattering-preventing cup 12 is connected to an up-and-down driving mechanism, any illustration thereof being omitted, and can be raised up and lowered down in the Z direction. When the substrate treating liquid or IPA is supplied to the substrate W, the scattering-preventing cup 12 is positioned at a predetermined site as illustrated in FIG. 1 through the up-and-down mechanism to surround the substrate W held by the chuck pins 54 from side positions of the substrate. This way makes it possible to collect the dry assistant liquid, IPA and other liquids that are scattered from the substrate W or the spin base 53.

The coolant supplying unit 81 will then be described.

The coolant supplying unit 81 is a unit which supplies the coolant to the back surface Wb of the substrate W, and includes, as shown in FIG. 1, at least a coolant storing part 82, a pipe 83, a valve 84 and a coolant supply pipe 85.

Figure 5:
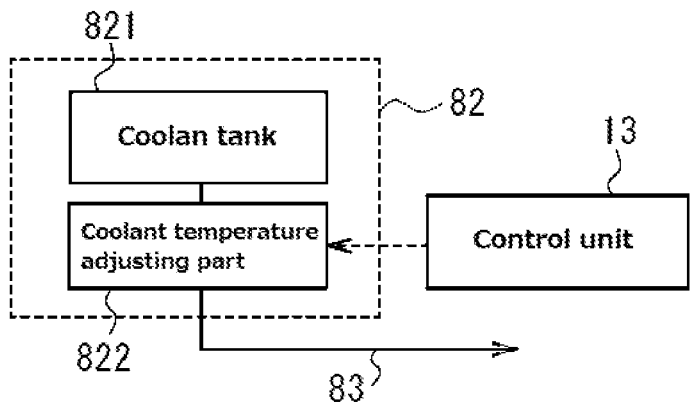
FIG. 5 is a block diagram showing a schematic configuration of a coolant supplying unit in the substrate treating apparatus.

FIG. 5 is a block diagram showing a schematic configuration of the coolant storing part 82. The coolant storing part 82 includes a coolant tank 821 which stores the coolant and a coolant temperature adjusting part 822 which adjusts the temperature of the coolant stored in the coolant tank 821.

The coolant temperature adjusting part 822 is electrically connected to the control unit 13, and heats or cools the coolant stored in the coolant tank 821 by the operation instruction of the control unit 13 so as to perform temperature adjustment. The temperature adjustment is preferably performed such that the coolant stored in the coolant tank 821 has a low temperature which is equal to or below the freezing point of the sublimable substance. The coolant temperature adjusting part 822 is not particularly limited, and for example, a known temperature adjustment mechanism can be used such as a chiller using a Peltier element or a pipe through which water whose temperature is adjusted is passed.

With reference back to FIG. 1, the coolant storing part 82 is connected through the pipe 83 with the pipeline to the coolant supply pipe 85, and the valve 84 is interposed partway through the path of the pipe 83. The coolant supply pipe 85 is provided by forming a through hole in the center portion of the spin base 53. The coolant within the coolant storing part 82 is pressurized by an unillustrated third pressurization unit so as to be fed to the pipe 82. Since the third pressurization unit can be realized by pressurization with a pump or the like or by compressing and storing the gas into the coolant storing part 82, any pressurization unit may be used.

The valve 84 is electrically connected to the control unit 13, and is normally closed. The opening and closing of the valve 84 is controlled by the operation instruction of the control unit 13. When the valve 84 is opened by the operation instruction of the control unit 13, the coolant is supplied through the pipe 83 and the coolant supply pipe 85 to the back surface Wb of the substrate W.

As the coolant, a liquid or a gas whose temperature is equal to or less than the freezing point of the sublimable substance can be mentioned. Furthermore, the liquid described above is not particularly limited, and examples thereof include cold water, methanol, ethanol, IPA, ethylene glycol, propylene glycol and the like. Alternatively, the liquid may be a mixed liquid obtained by mixing a plurality of types of liquids among these liquids. The gas described above is not particularly limited, and examples thereof include a gas inert to the sublimable substance and the solvent, and more specifically include nitrogen gas, helium gas, neon gas, argon gas, air (mixed gas of 80% of nitrogen gas by volume and 20% of oxygen gas by volume) and the like. Alternatively, the gas may be a mixed gas obtained by mixing a plurality of types of gases among these gases.

Figure 6:
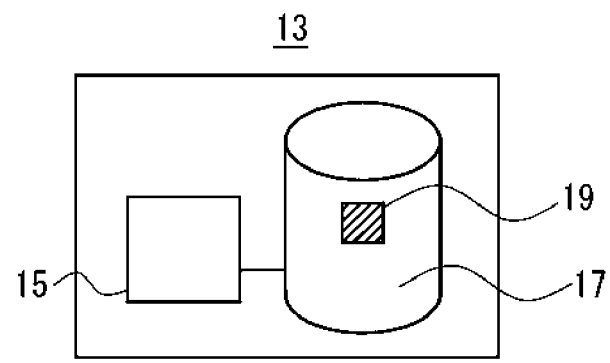
FIG. 6 is an illustrative diagram showing a schematic configuration of a control unit in the substrate treating apparatus.

FIG. 6 is a schematic view showing the configuration of the control unit 13. The control unit 13 is electrically connected to the individual portions of the substrate treating apparatus 1 (see FIG. 1), and controls the operations of the individual portions. The control unit 13 is formed with a computer which includes a computation processing part 15 and a memory 17. As the computation processing part 15, a CPU (Central Processing Unit) which performs various types of computation processing is used. The memory 17 includes a ROM (Read Only Memory) which is a read-only memory for storing basic programs, a RAM (Random Access Memory) which is a readable and writable memory for storing various types of information and a magnetic disc for storing control software, data or the like. In the magnetic disc, substrate treating conditions (recipes) corresponding to the substrate W are previously stored. The CPU reads the substrate treating conditions on the RAM so as to control the individual portions of the substrate treating apparatus 1 according to the details thereof.

<1-2 Substrate Treating Liquid>

The substrate treating liquid used in the first embodiment will be described below.

The substrate treating liquid (dry auxiliary liquid) of the first embodiment is a substrate treating liquid which contains at least the sublimable substance (dry auxiliary substance) in a molten state and the solvent. In dry processing for removing the liquids present on the pattern-formed surface of the substrate, the substrate treating liquid functions to assist the dry processing. The sublimable substance has the property of changing its phase from a solid phase to a gas phase or from a gas phase to a solid phase without the intervention of a liquid phase.

The sublimable substance is a substance which has a higher freezing point than the substrate treating liquid. The sublimable substance is also a substance which has a higher density than the substrate treating liquid. Hence, for example, when the temperature of the substrate treating liquid is lowered, and thus the solubility of the sublimable substance is lowered, an amount of sublimable substance which is so excessive as to be separated can be settled.

The sublimable substance is not particularly limited, and examples thereof include hexamethylenetetramine, 1,3,5-trioxane, ammonium 1-pyrrolidinecarbodithioate, meta-aldehyde, paraffin (CnH2 n+2 (n: 20 to 48)), t-butanol, par-adichlorobenzene, naphthalene, L-menthol and a fluorocarbon compound.

The fluorinated carbon compound is a compound in which a fluoro group is bound as a substituent to a carbon compound, and specifically, for example, the fluorinated carbon compound is preferably at least any one of compounds (A) to (E) below. These compounds can be used singly or a plurality thereof can be used together.

Compound (A): a fluoroalkane having 3 to 6 carbon atoms, or the fluoroalkane to which a substituent is bonded;

Compound (B): a fluorocycloalkane having 3 to 6 carbon atoms, or the fluorocycloalkane to which a substituent is bonded;

Compound (C): a fluorobicycloalkane having 10 carbon atoms, or the fluorobicycloalkane to which a substituent is bonded;

Compound (D): a fluorotetracyanoquinodimetane, or the fluorotetracyanoquinodimetane to which a substituent is bonded; and Compound (E): a fluorocyclotriphosphazene, or the fluorocyclotriphosphazene to which a substituent is bonded.

[Compound (A)]

The compound (A) may be a fluoroalkane having 3 to 6 carbon atoms and represented by the general formula (1):

[Chemical Formula 1]

$$C_mH_nF_{2m+2-n} \tag{1}$$

wherein m represents an integer of 3 to 6 both inclusive, n represents an integer of 0 or more, and "2m+2−n">1.

More specific examples of the fluoroalkane having 3 carbon atoms include $CF_3CF_2CF_3$, $CHF_2CF_2CF_3$, $CH_2FCF_2CF_3$, $CH_3CF_2CH_3$, $CHF_2CF_2CH_3$, $CH_2FCF_2CH_3$, $CH_2FCF_2CH_2F$, $CHF_2CF_2CHF_2$, $CF_3CHFCF_3$, $CH_2FCHFCF_3$, $CHF_2CHFCF_3$, $CH_2FCHFCH_2F$, $CH_2FCHFCHF_2$, $CH_3CHFCH_3$, $CH_2FCHFCH_3$, $CHF_2CHFCH_3$, $CF_3CH_2CF_3$, $CH_2FCH_2CF_3$, $CHF_2CH_2CF_3$, $CH_2FCH_2CH_2F$, $CH_2FCH_2CHF_2$, $CHF_2CH_2CHF_2$, $CH_3CH_2CH_2F$, and $CH_3CH_2CHF_2$.

Examples of the fluoroalkane having 4 carbon atoms include $CF_3(CF_2)_2CF_3$, $CF_3(CF_2)_2CH_2F$, $CF_3CF_2CH_2CF_3$, $CHF_2(CF_2)_2CHF_2$, $CHF_2CHFCF_2CHF_2$, $CF_3CH_2CF_2CHF_2$, $CF_3CHFCH_2CF_3$, $CHF_2CHFCHFCHF_2$, $CF_3CH_2CF_2CH_3$, $CF_3CF_2CH_2CH_3$, $CF_3CHFCF_2CH_3$, and $CHF_2CH_2CF_2CH_3$.

Examples of the fluoroalkane having 5 carbon atoms include $CF_3(CF_2)_3CF_3$, $CF_3CF_2CF_2CHFCF_3$, $CHF_2(CF_2)_3CF_3$, $CHF_2(CF_2)_3CHF_2$, $CF_3CH(CF_3)CH_2CF_3$, $CF_3CHFCF_2CH_2CF_3$, $CF_3CF(CF_3)CH_2CHF_2$, $CHF_2CHFCF_2CHFHF_2$, $CF_3CH_2CF_2CH_2CF_3$, $CHF_2(CF_2)_2CHFCH_3$, $CHF_2CH_2CF_2CH_2CHF_2$, and $CF_3(CH_2)_3CF_3$, $CF_3CHFCHFCF_2CF_3$.

Examples of the fluoroalkane having 6 carbon atoms include $CF_3(CF_2)_4CF_3$, $CF_3(CF_2)_4CHF_2$, $CF_3(CF_2)_4CH_2F$, $CF_3CH(CF_3)CHFCF_2CF_3$, $CHF_2(CF_2)_4CHF_2$, $CF_3CF_2CH_2CH(CF_3)CF_3$, $CF_3CF_2(CH_2)_2CF_2CF_3$, $CF_3CH_2(CF_2)_2CH_2CF_3$, $CF_3(CF_2)_3CH_2CF_3$, $CF_3CH(CF_3)(CH_2)_2CF_3$, $CHF_2CF_2(CH_2)_2CF_2CHF_2$, $CF_3(CF_2)_2(CH_2)_2CH_3$.

The compound (A) may be the fluoroalkane, which has 3 to 6 carbon atoms, to which a substituent is bonded. The substituent may be at least one selected from the group consisting of halogen groups other than a fluoro group (specifically, chloro, bromo and iodo groups), a hydroxyl group, an oxygen atom, alkyl groups, a carboxyl group, and perfluoroalkyl groups.

Examples of the alkyl group include methyl, ethyl, n-propyl, isopropyl, n-butyl, and t-butyl groups.

The perfluoroalkyl group is not particularly limited, and examples thereof include any saturated perfluoroalkyl group, and any unsaturated perfluoroalkyl group. The perfluoroalkyl group may have a linear structure or a branched structure. More specific examples of the perfluoroalkyl group include trifluoromethyl, perfluoroethyl, perfluoro-n-propyl, perfluoroisopropyl, perfluoro-n-butyl, perfluoro-sec-butyl, perfluoro-tert-butyl, perfluoro-n-amyl, perfluoro-sec-amyl, perfluoro-tert-amyl, perfluoroisoamyl, perfluoro-n-hexyl, perfluoroisohexyl, perfluoroneohexyl, perfluoro-n-heptyl, perfluoroisoheptyl, perfluoroneoheptyl, perfluoro-n-octyl, perfluoroisooctyl, perfluoroneooctyl, perfluoro-n-nonyl, perfluoroneononyl, perfluoroisononyl, perfluoro-n-decyl, perfluoroisodecyl, perfluoroneodecyl, perfluoro-sec-decyl, and perfluoro-tert-decyl groups.

[Compound (B)]

Examples of the compound (B) include fluorocycloalkanes which are represented by general formula (2) below and which have 3 to 6 carbon atoms.

[Chemical Formula 2]

$$C_mH_nF_{2m-n} \quad (2)$$

wherein m represents an integer of 3 to 6 both inclusive, n represents an integer of 0 or more, and "2m−n">1.

More specific examples of the fluorocycloalkane having 3 to 6 carbon atoms include monofluorocyclohexane, dodecafluorocyclohexane, 1,1,4-trifluorocyclohexane, 1,1,2,2-tetrafluorocyclbutane, 1,1,2,2,3-pentafluorcyclobutane, 1,2,2,3,3,4-hexafluorocyclobutane, 1,1,2,2,3,3-hexafluorocyclobutane, 1,1,2,2,3,3-hexafluorocyclobutane, 1,1,2,2,3,4-hexafluorocyclobutane, 1,1,2,2,3,3-hexafluorocyclopentane, 1,1,2,2,3,4-hexafluorolcyclopentane, 1,1,2,2,3,3,4-heptafluorocyclopentane, 1,1,2,2,3,3,4,5-heptafluorocyclopentane, 1,1,2,2,3,3,4,4-octafluorocyclopentane, 1,1,2,2,3,3,4,5-octafluorocyclopentane, 1,1,2,2,3,4,5-octafluorocyclopentane, 1,1,2,2,3,4,5,6-octafluorocyclohexane, 1,1,2,2,3,3,4,4-octafluorocyclohexane, 1,1,2,2,3,3,4,4-octafluorocyclohexane, 1,1,2,2,3,3,4,5-octafluorocyclohexane, 1,1,2,2,3,4,4,5,6-octafluorocyclohexane, 1,1,2,2,3,3,4,4,5-nonafluorocyclohexane, 1,1,2,2,3,3,4,5,6-nonafluorocyclohexane, 1,1,2,2,3,3,4,5,5,6-nonafluorocyclohexane, 1,1,2,2,3,3,4,4,5,6-decafluorocyclohexane, 1,1,2,2,3,3,4,4,5,5-decafluorocycohexane, 1,1,2,2,3,3,4,4,5,6-decafluorocyclohexane, 1,1,2,2,3,3,4,4,5,6-decafluorocyclohexane, perfluorocyclopropane, perfluorocyclobutane, perfluorocyclopentane, and perfluorocyclohexane.

The compound (B) may be the fluorocycloalkane, which has 3 to 6 carbon atoms, to which a substituent is bonded. The substituent may be at least one selected from the group consisting of halogen groups other than a fluoro group (specifically, chloro, bromo and iodo groups), a hydroxyl group, an oxygen atom, alkyl groups, a carboxyl group, and perfluoroalkyl groups. The alkyl group and the perfluoroalkyl group are not particularly limited. Examples thereof are the same as described about the compound (A).

Specific examples of the compound (B) in which a substituent is bonded to the fluorocycloalkane, which has 3 to 6 carbon atoms, include 1,2,2,3,3-tetrafluoro-1-trifluoromethylcyclobutane, 1,2,4,4-tetrafluoro-1-trifluoromethylcyclobutane, 2,2,3,3-tetrafluoro-1-trifluoromethylcyclobutane, 1,2,2-trifluoro-1-trimethylcyclobutane, 1,4,4,5,5-pentafluoro-1,2,2,3,3-pentamethylcyclopentane, 1,2,5,5-tetrafluoro-1,2-dimethylcyclopentane, 3,3,4,4,5,5,6,6-octafluoro-1,2-dimethylcyclohexane, 1,1,2,2-tetrachloro-3,3,4,4-tetrafluorocyclobutane, 2-fluorocyclohexanol, 4,4-difluorocyclohexanone, 4,4-difluorocyclohexanecarboxylic acid, 1,2,2,3,3,4,4,5,5,6,6-undecafluoro-1-(nonafluorobutyl)cyclohexanone, perfluoromethylcyclopropane, perfluorodimethylcyclopropane, perfluorotrimethylcyclopropane, perfluoromethylcyclobutane, perfluorodimethylcyclobutane, perfluorotrimethylcyclobutane, perfluoromethylcyclopentane, perfluorodimethylcyclopentane, perfluorotrimethylcyclopentane, perfluoromethylcyclohexane, perfluorodimethylcyclohexane, and perfluorotrimethylcyclohexane.

[Compound (C)]

Examples of the fluorobicycloalkane, which has 10 carbon atoms, as the compound (C) include fluorobicyclo[4.4.0]decane, fluorobicyclo[3.3.2]decane, perfluorobicyclo[4.4.0]decane, and perfluorobicyclo[3.3.2]decane.

The compound (C) may be the fluorobicycloalkane, which has 10 carbon atoms, to which a substituent is bonded. The substituent may be a halogen radical other than a fluoro group (specifically, a chloro, bromo or iodo groups), a cycloalkyl group which may have a halogen atom, or an alkyl group having a cycloalkyl group which may have a halogen atom.

In the cycloalkyl group which may have a halogen atom, examples of the halogen atom include fluorine, chlorine, bromine and iodine atoms. Examples of the cycloalkyl group which may have a halogen atom include cyclopropyl, cyclobutyl, cyclopentyl, cyclohexyl, cycloheptyl, perfluorocyclopropyl, perfluorocyclobutyl, perfluorocyclopentyl, perfluorocyclohexyl, and perfluorocycloheptyl groups.

In the alkyl group having a cycloalkyl group which may have a halogen atom, examples of the halogen atom include fluorine, chlorine, bromine and iodine atoms. In the alkyl group having a cycloalkyl group which may have a halogen atom, this cycloalkyl group, which may have a halogen atom, may be, for example, a cyclopropyl, cyclobutyl, cyclopentyl, cyclohexyl, cycloheptyl, perfluorocyclopropyl, perfluorocyclobutyl, perfluorocyclopentyl, perfluorocyclohexyl or perfluorcycloheptyl group. A specific example of the alkyl group having a cycloalkyl group which may have a halogen atom is a difluoro(undecafluorocyclohexyl)methyl group.

A specific example of the compound (C) in which a substituent is bonded to the fluorobicycloalkane, which has 10 carbon atoms, is 2-[difluoro(undecafluorocyclohexyl) methyl]-1,1,2,3,3,4,4,4a,5,5,6,6,7,7,8,8,8a-heptadecafluoro-decahydronaphthalene.

[Compound (D)]

An example of the fluorotetracyanoquinodimethane as the compound (D) is tetrafluorocyanoquinodimethane.

The compound (D) may be, for example, a compound in which at least one of halogen groups other than a fluoro group (specifically, chloro, bromo, and iodo groups) is bonded to the fluorotetracyanoquinodimethane.

[Compound (E)]

Examples of the fluorocyclotriphosphazene as the compound (E) include hexafluorocyclotriphosphazene, octafluorocyclotetraphosphazene, decafluorocyclopentaphosphazene, and dodecafluorocyclohexaphosphazene.

The compound (E) may be a compound in which a substituent is bonded to the fluorocyclotriphosphazene. Examples of the substituent include halogen groups other than a fluoro group (specifically, chloro, bromo and iodo groups), and phenoxy and alkoxy (—OR) groups. Examples of R in the alkoxy groups include alky, fluoroalkyl, and aromatic groups. Examples of R include methyl, ethyl and other alkyl groups; trifluoromethyl and other fluoroalkyl groups; and phenyl and other aromatic groups.

Specific examples of the compound (E) in which a substituent as described above is bonded to the fluorocyclotriphosphazene include hexachlorocyclotriphosphazene, octachlorocyclotetraphosphazene, decachlorocyclopentaphosphazene, dodecacyclohexaphosphazene, and hexaphenoxycyclotriphosphazene.

Preferably, as the solvent, the freezing point thereof is lower than that of the sublimable substance, and the density thereof is lower than that of the sublimable substance. Preferably, the solvent is inert to the sublimable substance, and does not modify the sublimable substance. As an example of the solvent described above, at least one type selected from the group consisting of pure water, DIW, aliphatic hydrocarbon, aromatic hydrocarbon, ester, alcohol and ether can be mentioned. More specifically, at least one type can be mentioned which is selected from a group consisting of pure water, DIW, methanol, ethanol, IPA, butanol, ethylene glycol, propylene glycol, NMP (N-methyl-2-pyrrolidone), DMF (N,N-dimethylformamide), DMA (N,N-dimethylacetamide), DMSO (dimethyl sulfoxide), hexane, toluene, PGMEA (propylene glycol monomethyl ether acetate), PGME (propylene glycol monomethyl ether), PGPE (propylene glycol monopropyl ether), PGEE (propylene glycol monoethyl ether), GBL (γ-butyrolactone), acetylacetone, 3-pentanone, 2-heptanone, ethyl lactate, cyclohexanone, dibutyl ether, HFE (hydrofluoroether), ethyl nonafluoroisobutyl ether, ethyl nonafluorobutyl ether and m-xylene hexafluoride.

The concentration of the sublimable substance in the substrate treating liquid is not particularly limited, and can be selected as necessary according to the sublimable substance and the solvent which are used.

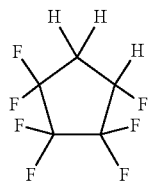

[Chemical Formula 3]

<1-3 Substrate Treating Method>

A substrate treating method using the substrate treating apparatus 1 of the present embodiment will then be described below with reference to FIGS. 7 and 8.

Figure 7:
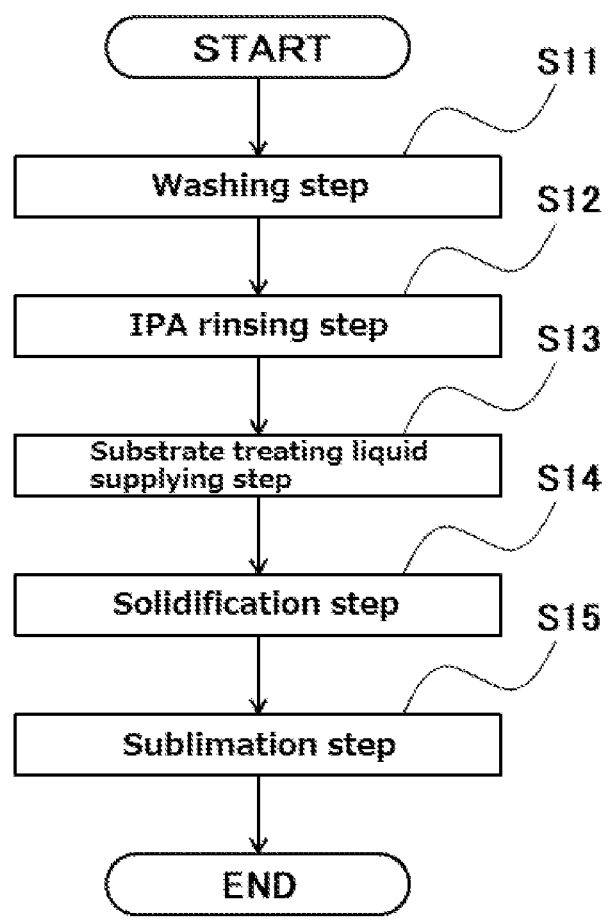
FIG. 7 is a flowchart showing a substrate treating method using the substrate treating apparatus.
Figure 8:
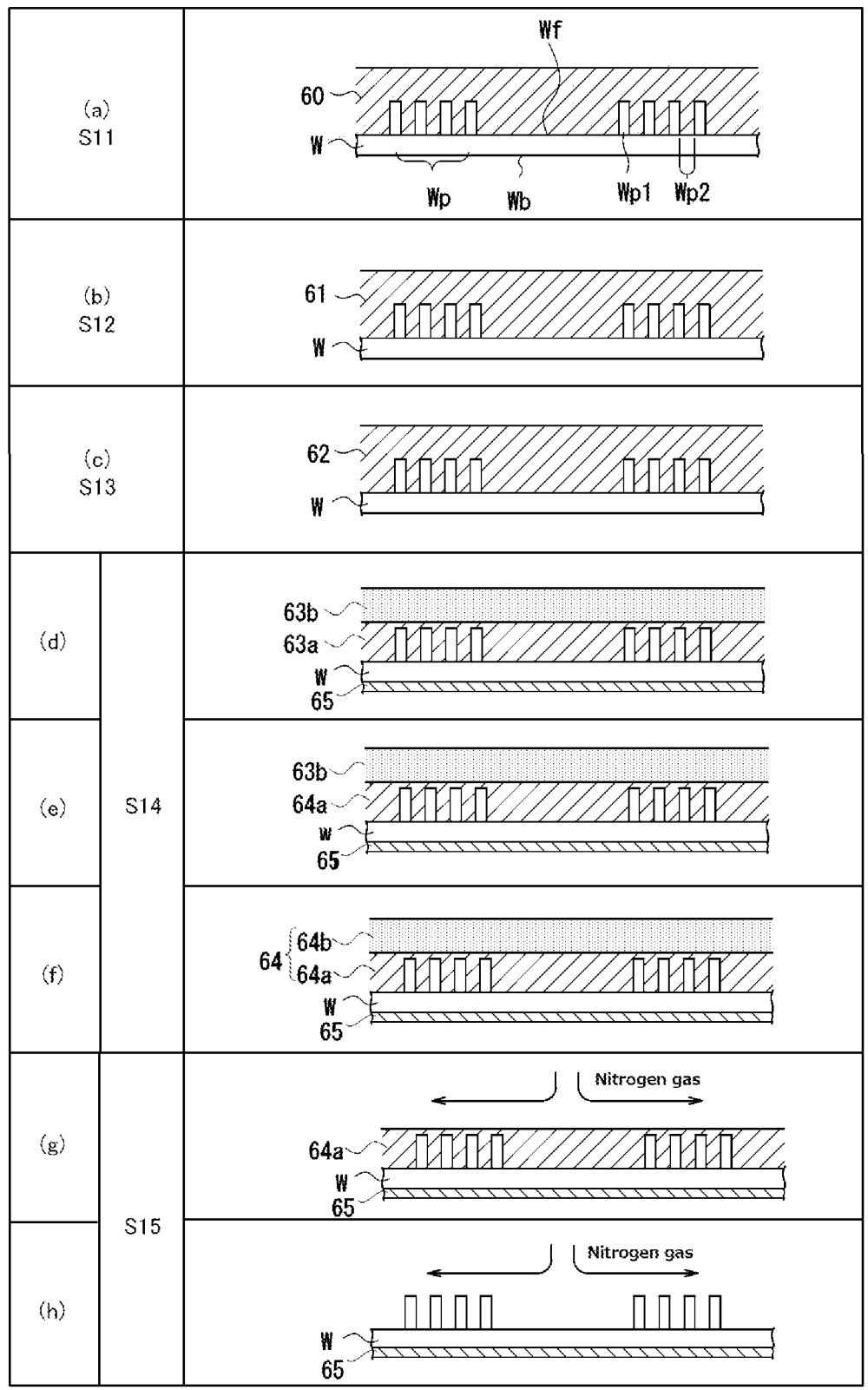
FIG. 8 is a diagram showing the state of the substrate in each step of the substrate treating method according to the first embodiment.

FIG. 7 is a flowchart showing the operation of the substrate treating apparatus 1 according to the first embodiment. FIG. 8 is a schematic view showing the state of the substrate W in each step of FIG. 7. On the substrate W, a concave/convex pattern Wp is formed in the preceding step. The pattern Wp includes convex portions Wp1 and concave portions Wp2. In the present embodiment, the height of the convex portion Wp1 falls within a range of 100 to 600 nm, and the width thereof falls within a range of 5 to 50 nm. The shortest distance between the two adjacent convex portions Wp1 (the shortest width between the concave portions Wp2) falls within a range of 5 to 150 nm. The aspect ratio of the convex portion Wp1, that is, a value (height/width) obtained by dividing the height by the width falls within a range of 5 to 35.

The individual steps shown in FIGS. 8(a) to 8(e) are performed under the atmospheric pressure unless otherwise explicitly indicated. Here, the atmospheric pressure refers to a pressure which is equal to or more than 0.7 atmospheres and equal to or less than 1.3 atmospheres with the standard atmospheric pressure (1 atmosphere, 1013 hPa) in the center. In particular, when the substrate treating apparatus 1 is arranged within a clean room having a positive pressure, the pressure of the front surface Wf of the substrate W is higher than 1 atmosphere.

In FIG. 7, an operator first provides an instruction to perform a substrate treating program 19 corresponding to a predetermined substrate W. Thereafter, as a preparation for loading the substrate W into the substrate treating apparatus 1, the operation instruction is provided by the control unit 13, and thus the substrate treating apparatus 1 performs the following operation.

The rotation of the rotation drive portion 52 is stopped, and the chuck pins 54 are located in positions suitable for receiving and delivering the substrate W. Then, the chuck pins 54 are brought into an opened state by an unillustrated opening/closing mechanism.

When the unprocessed substrate W is loaded into the substrate treating apparatus 1 by an unillustrated substrate loading/unloading mechanism and is placed on the chuck pins 54, the chuck pins 54 are brought into a closed state by the unillustrated opening/closing mechanism.

After the unprocessed substrate W is held by the substrate holding unit 51, a washing step S11 is performed on the substrate with an unillustrated wet washing unit. The washing step S11 includes rinse processing for supplying a washing liquid to the front surface Wf of the substrate W so as to perform washing and then removing the washing liquid. The supply of the washing liquid (in the case of the rinse processing, a rinse liquid) is performed, by the operation instruction to the rotarily driving part 52 provided by the control unit 13, on the front surface Wf of the substrate W which is rotated about the shaft A1 at a constant speed. The washing liquid is not particularly limited, and for example, SC-1 (liquid containing ammonia, a hydrogen peroxide solution and water), SC-2 (liquid containing hydrochloric acid, a hydrogen peroxide solution and water) and the like can be mentioned. The rinse liquid is not particularly limited, and for example, DIW and the like can be mentioned. The amounts of washing liquid and rinse liquid supplied are not particularly limited, and can be set as necessary according to the range which is washed and the like. The washing time is not particularly limited, and can be set as necessary.

In the first embodiment, the wet washing unit is used, thus the SC-1 is supplied to the front surface Wf of the substrate W so as to wash the front surface Wf and thereafter the DIW is further supplied to the front surface Wf so as to remove the SC-1.

FIG. 8(a) shows a state of the substrate W when the washing step S11 is completed. As shown in FIG. 8(a), on the front surface Wf of the substrate W on which the pattern Wp is formed, the DIW (represented by "60" in the figure) supplied in the washing step S11 adhered.

With reference back to FIG. 7, an IPA rinsing step S12 of supplying the IPA to the front surface Wf of the substrate W on which the DIW 60 is adhered is performed. The control unit 13 first provides the operation instruction to the rotation drive portion 52 such that the substrate W is rotated about the axis A1 at a constant speed.

Then, the control unit 13 provides the operation instruction to the revolvingly driving part 14 such that the nozzle 32 is located in the center portion of the front surface Wf of the substrate W. Then, the control unit 13 provides the operation instruction to the valve 36 such that the valve 36 is opened. In this way, the IPA is supplied from the IPA tank 37 through the pipe 35 and the nozzle 32 to the front surface Wf of the substrate W.

The IPA supplied to the front surface Wf of the substrate W is made to flow from around the center of the front surface Wf of the substrate W toward the circumferential edge portion of the substrate W by a centrifugal force generated by the rotation of the substrate W so as to be diffused over the entire front surface Wf of the substrate W. In this way, the DIW adhered to the front surface Wf of the substrate W is removed by the supply of the IPA, and thus the entire front surface Wf of the substrate W is covered with the IPA. The rotation speed of the substrate W is preferably set such that the thickness of the film formed of the IPA is higher than the height of the convex portion Wp1 on the entire front surface Wf. The amount of IPA supplied is not particularly limited, and can be set as necessary.

After the completion of the IPA rinsing step S12, the control unit 13 provides the operation instruction to the valve 36 such that the valve 36 is closed. The control unit 13 also provides the operation instruction to the revolvingly driving part 14 such that the nozzle 32 is located in the retraction position P2.

FIG. 8(b) shows a state of the substrate W when the IPA rinsing step S12 is completed. As shown in FIG. 8(b), on the front surface Wf of the substrate W on which the pattern Wp is formed, the IPA (represented by "61" in the figure) supplied in the IPA rinsing step S12 is adhered, and the DIW 60 is replaced by the IPA 61 so as to be removed from the front surface Wf of the substrate W.

With reference back to FIG. 7, a substrate treating liquid supply step S13 of supplying the substrate treating liquid containing the sublimable substance in the molten state to the front surface Wf of the substrate W on which the IPA 61 is adhered is then performed. The control unit 13 first provides the operation instruction to the rotation drive portion 52 such that the substrate W is rotated about the axis A1 at a constant speed. Here, the rotation speed of the substrate W is preferably set such that the thickness of the liquid film formed of the substrate treating liquid is higher than the height of the convex portion Wp1 on the entire front surface Wf.

Then, the control unit 13 provides the operation instruction to the revolvingly driving part 14 such that the nozzle 22 is located in the center portion of the front surface Wf of the substrate W. Then, the control unit 13 provides the operation instruction to the valve 26 such that the valve 26 is opened. In this way, the substrate treating liquid is supplied from the substrate treating liquid storage tank 271 through the pipe 25 and the nozzle 22 to the front surface Wf of the substrate W.

The temperature of the supplied substrate treating liquid is preferably set within a range equal to or more than the meting point of the sublimable substance and less than the boiling point thereof so that the sublimable substance in the molten state is present in the substrate treating liquid after the supply of the substrate treating liquid to the front surface Wf of the substrate W. However, the sublimable substance needs to be contained in the substrate treating liquid such that the thickness of a film (the details of which will be described later) of the solidified body formed of the excessive amount of sublimable substance which is settled when the substrate treating liquid is solidified is equal to or more than the height of the pattern. Hence, from the viewpoint described above, the temperature of the substrate treating liquid is preferably set within the temperature range described above. For example, when as the sublimable substance, 1,1,2,2,3,3,4-heptafluorocyclopentane (having a melting point of 20.5° C. and a boiling point of 82.5° C.) is used, and as the solvent, the DIW (having a melting point of 0° C. and a boiling point of 100° C.) is used, the temperature of the substrate treating liquid supplied to the front surface Wf of the substrate W is preferably set within a range equal to or more than 35° C. and equal to or less than 82° C. with consideration given to, for example, the lowering of the temperature of the substrate treating liquid caused by heat transfer from the substrate treating liquid to the substrate W and the gas present within the chamber 11, and is more preferably set within a range equal to or more than 40° C. and equal to or less than 80° C. The amount of substrate treating liquid supplied is not particularly limited, and can be set as necessary.

In a case where the temperature of the substrate W and the temperature within the chamber 11 are equal to or less than the freezing points of the sublimable substance and the solvent, when the substrate treating liquid whose temperature slightly exceeds the freezing points of the sublimable substance and the solvent is supplied to the substrate W, the substrate treating liquid may be solidified within a very short period of time after contact with the substrate W. In such a case, it is impossible to form the solidified body whose thickness is uniform, and thus it is difficult to reduce dry unevenness. Hence, when the temperature of the substrate W and the temperature within the chamber 11 are equal to or less than the freezing points of the sublimable substance and the solvent, temperature adjustment is preferably performed such that the temperature of the substrate treating liquid is sufficiently higher than the freezing points of the sublimable substance and the solvent.

The substrate treating liquid supplied to the front surface Wf of the substrate W is made to flow from around the center of the front surface Wf of the substrate W toward the circumferential edge portion of the substrate W by the centrifugal force generated by the rotation of the substrate W so as to be diffused over the entire front surface Wf of the substrate W. In this way, the IPA adhered to the front surface Wf of the substrate W is removed by the supply of the substrate treating liquid, and thus the entire front surface Wf of the substrate W is covered with the substrate treating liquid. After the completion of the substrate treating liquid supply step S13, the control unit 13 provides the operation instruction to the valve 26 such that the valve 26 is closed. The control unit 13 also provides the operation instruction to the revolvingly driving part 14 such that the nozzle 22 is located in the retraction position P1.

FIG. 8(c) shows a state of the substrate W when the substrate treating liquid supply step S13 is completed. As shown in FIG. 8(c), on the front surface Wf of the substrate W on which the pattern Wp is formed, the substrate treating liquid (represented by "62" in the figure) supplied in the substrate treating liquid supply step S13 is adhered, and the IPA 61 is replaced by the substrate treating liquid 62 so as to be removed from the front surface Wf of the substrate W.

With reference back to FIG. 7, a solidification step S14 of solidifying the substrate treating liquid 62 supplied to the front surface Wf of the substrate W so as to form a solidified film of the sublimable substance and the solvent is then performed. The control unit 13 first provides the operation instruction to the rotation drive portion 52 such that the substrate W is rotated about the axis A1 at a constant speed. Here, the rotation speed of the substrate W is set such that the substrate treating liquid 62 can form a predetermined film thickness higher than the convex portion Wp1 on the entire front surface Wf.

Then, the control unit 13 provides the operation instruction to the valve 84 such that the valve 84 is opened. In this way, the coolant (in the present embodiment, −10° C.) is supplied from the coolant storing part 82 through the pipe 83 and the coolant supply pipe 85 toward the back surface Wb of the substrate W.

The coolant supplied toward the back surface Wb of the substrate W is made to flow from around the center of the back surface Wb of the substrate W toward the direction of the circumferential edge portion of the substrate W by the centrifugal force generated by the rotation of the substrate W so as to be diffused over the entire back surface Wb of the substrate W. In this way, the liquid film of the substrate treating liquid 62 formed on the front surface Wf of the substrate W is cooled to a temperature equal to or less than the freezing points of the sublimable substance and the solvent.

Here, when the cooling of the substrate treating liquid is started, the solubility of the sublimable substance in the solvent is lowered, and thus the excessive amount of sublimable substance appears. Then, the density of the sublimable substance is higher than that of the substrate treating liquid, and thus the amount of sublimable substance which is so excessive as to appear is settled in the liquid film of the substrate treating liquid. In part other than the liquid layer part in which the excessive amount of sublimable substance is settled, a liquid layer part is formed in which the sublimable substance is present in a saturated state. When the cooling further proceeds, since the freezing point of the sublimable substance is higher than that of the substrate treating liquid, the liquid layer part in which the excessive amount of sublimable substance is settled is first solidified so as to form a solidified body layer (hereinafter referred to as the "lower side solidified body layer"). Then, the liquid layer part in which the sublimable substance is present in the saturated state is solidified so as to form a solidified body layer (hereinafter referred to as the "upper side solidified body layer"), with the result that the solidified body is formed on the front surface Wf of the substrate W.

Here, the film thickness of the lower side solidified body layer is preferably equal to or higher than the convex portion Wp1 of the pattern in the entire front surface Wf. In this way, for example, as compared with a solidified body formed of the substrate treating liquid containing the solvent, it is possible to minimize the influence of a surface tension exerted on the pattern in a sublimation step. Consequently, it is possible to reduce the occurrence of collapse of the pattern as in a case where as the substrate treating liquid, a liquid is used which is formed of only the sublimable substance or beyond the case. Moreover, it is possible to reduce the amount of sublimable substance used as compared with a conventional substrate treating liquid.

When the temperature of the coolant for cooling the substrate treating liquid is higher than the freezing point of the liquid layer part in which the sublimable substance is present in the saturated state, the sublimable substance is present in a liquid state without the upper side solidified body layer being formed. In this case, for example, immediately after the solidification step S14, a spin-off step may be performed which spins off the liquid layer part by utilization of the centrifugal force generated by the rotation of the substrate W.

FIG. 8(d) shows a state where the liquid layer part 63a in which the excessive amount of sublimable substance is settled and the liquid layer part 63b in which the sublimable substance is present in the saturated state are formed on the substrate W by the cooling of the substrate treating liquid with the coolant (represented by "65" in the figure) in the solidification step S14. FIG. 8(e) shows a state where the liquid layer part 63a in which the excessive amount of sublimable substance is settled is first solidified so as to form the lower side solidified body layer 64a. FIG. 8(f) shows a state where the liquid layer part 63b in which the sublimable substance is present in the saturated state is solidified so as to form the upper side solidified body layer 64b and where thus the solidified body 64 is obtained.

With reference back to FIG. 7, the sublimation step S15 of subliming the solidified body 64 of the substrate treating liquid formed on the front surface Wf of the substrate W so as to remove it from the front surface Wf of the substrate W is then performed. In the sublimation step S15, the coolant is also supplied to the back surface Wb of the substrate W with the coolant supplying unit 81 continuously after the solidification step S14. In this way, the solidified body 64 of the substrate treating liquid can be cooled at a temperature equal to or less than the freezing point of the sublimable substance, and thus it is possible to prevent the solidified body 64 of the substrate treating liquid from being melted.

In the sublimation step S15, the control unit 13 first provides the operation instruction to the rotation drive portion 52 such that the substrate W is rotated about the axis A1 at a constant speed. Here, the rotation speed of the substrate W is set such that the substrate treating liquid 62 can form a predetermined film thickness higher than the convex portion Wp1 on the entire front surface Wf.

Then, the control unit 13 provides the operation instruction to the revolvingly driving part 14 such that the nozzle 42 is located in the center portion of the front surface Wf of the substrate W. Then, the control unit 13 provides the operation instruction to the valve 46 such that the valve 46 is opened. In this way, the gas (in the present embodiment, nitrogen gas having a temperature of −10° C.) is supplied through the pipe 45 and the nozzle 42 from the gas storing part 47 toward the front surface Wf of the substrate W.

Here, the partial pressure of the vapor of the sublimable substance in the nitrogen gas is set lower than the saturated vapor pressure of the sublimable substance at a temperature when the nitrogen gas is supplied. Hence, the nitrogen gas described above makes contact with the solidified body 64, and thus the upper side solidified body layer 64b in the solidified body 64 is first sublimed. Thereafter, the lower side solidified body layer 64a formed by the settling of the excessive amount of sublimable substance is sublimed, and thus all the solidified body 64 is sublimed. Since the nitrogen gas has a temperature lower than the freezing points of the sublimable substance and the solvent, it is possible to sublime the solidified body 64 of the substrate treating liquid while preventing the melting of the solidified body 64 of the substrate treating liquid.

Hence, when the substances such as the IPA present on the front surface Wf of the substrate W are removed, the substances such as the IPA present on the front surface Wf of the substrate W are replaced by the substrate treating liquid, the substrate treating liquid is solidified, the solidified body 64 of the substrate treating liquid is sublimed and thus it is possible to satisfactorily dry the front surface Wf of the substrate W while reducing the collapse of the pattern caused by the surface tension of the substrate treating liquid on the pattern Wp.

FIG. 8(g) shows a state of the substrate W when the sublimation of the upper side solidified body layer 64b is completed in the sublimation step S15. FIG. 8(h) shows a state of the substrate W when the sublimation of the lower side solidified body layer 64a is completed. As shown in FIGS. 8(g) and 8(h), the solidified body 64 formed in the solidification step S14 is sublimed by the supply of the nitrogen gas having a temperature of −10° C. so as to be removed from the front surface Wf, with the result that the drying of the front surface Wf of the substrate W is completed.

After the completion of the sublimation step S15, the control unit 13 provides the operation instruction to the valve 46 and the valve 84 such that the valve 46 and the valve 84 are closed. The control unit 13 also provides the operation instruction to the revolvingly driving part 14 such that the nozzle 42 is located in the retraction position P3.

In this way, a series of substrate dry treating steps are completed. After the substrate dry treating as described above, the substrate W on which the dry treating has been performed is unloaded from the chamber 11 by the unillustrated substrate loading/unloading mechanism.

As described above, in the present embodiment, the saturated solution of the sublimable substance is supplied to the front surface Wf of the substrate W to which the IPA is adhered, the substrate treating liquid is solidified on the front surface Wf of the substrate W so as to form the solidified body containing the sublimable substance and thereafter the solidified body is sublimed so as to be removed from the front surface Wf of the substrate W, with the result that the dry treating is performed on the substrate W. Then, when the solidified body is formed, the solubility of the sublimable substance in the solvent is lowered, thereafter the excessive amount of sublimable substance is settled and the solidified body formed of the settled sublimable substance is adjusted such that the height thereof is equal to or higher than at least the height of the convex portion Wp1 of the pattern. In this way, in the present embodiment, it is possible to reduce the collapse of the pattern as in a case where as the substrate treating liquid, a liquid is used which is formed of only the sublimable substance or beyond the case, and moreover, it is possible to reduce the amount of sublimable substance used as compared with the conventional substrate treating liquid. It is also possible to reduce the production of a residue after the sublimation step by the reduction of the amount of sublimable substance used.

Second Embodiment

A second embodiment according to the present invention will be described below. The present embodiment differs from the first embodiment in that in the solidification step S14, instead of the supply of the coolant with the coolant supplying unit 81, the supply of the nitrogen gas with the gas supplying unit 41 is performed and that in the sublimation step S15, only the nitrogen gas is supplied without the coolant being supplied to the back surface Wb of the substrate W. The present embodiment also differs from the first embodiment in that after the sublimation step S15 is performed, an inert gas supply step S16 such as for preventing condensation on the front surface Wf of the substrate W is performed. Even in the configuration described above, it is possible to satisfactorily dry the surface of the substrate while reducing the collapse of the pattern.

<2-1 Substrate Treating Apparatus and Substrate Treating Liquid>

Figure 9:
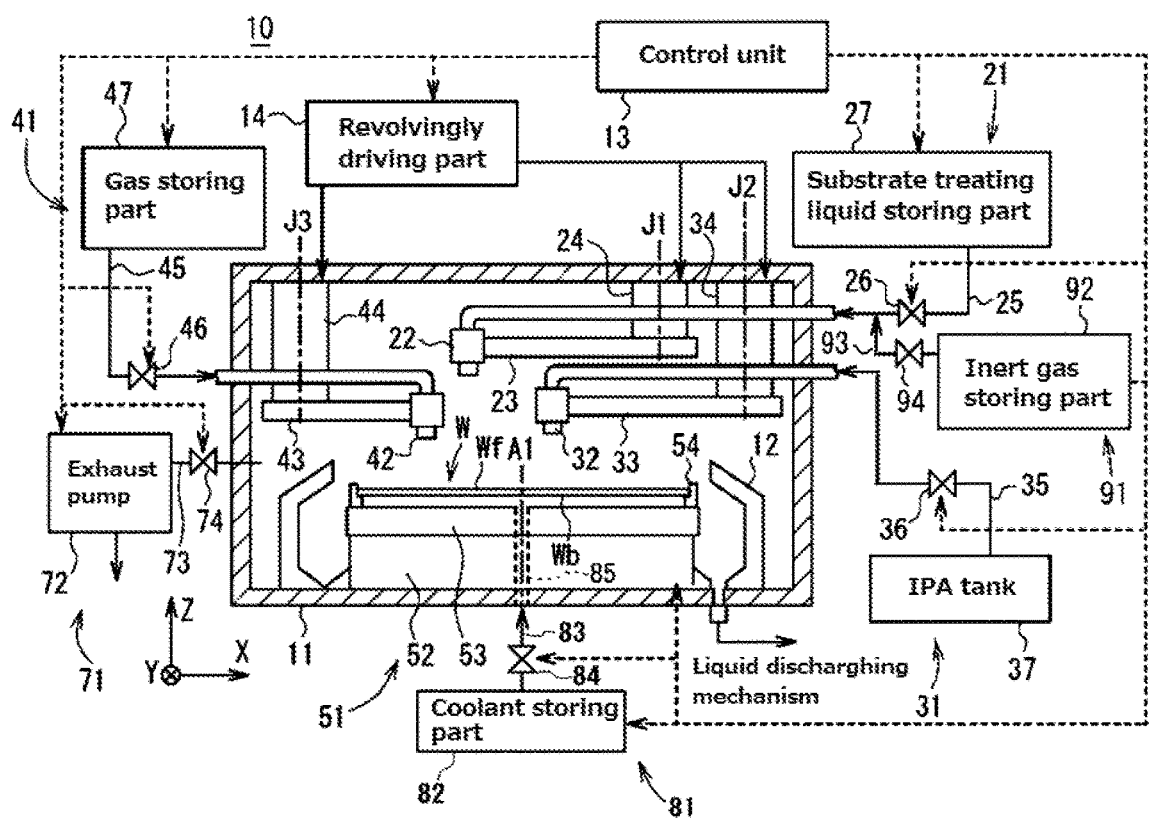
FIG. 9 is an illustrative diagram showing an outline of a substrate treating apparatus according to a second embodiment of the present invention.

A substrate treating apparatus according to the second embodiment will be described with reference to FIG. 9 as necessary. FIG. 9 is an illustrative diagram schematically showing the substrate treating apparatus according to the present embodiment.

The substrate treating apparatus 10 according to the second embodiment basically has the same configuration as the substrate treating apparatus 1 according to the first embodiment (see FIG. 9) except that the substrate treating apparatus 10 includes an inert gas supplying unit 91. A control unit according to the second embodiment has the same configuration as the control unit 13 according to the first embodiment. Hence, those which have the same functions are identified with the same symbols, and the description thereof will be omitted.

The inert gas supplying unit 91 is a unit which supplies an inert gas having room temperature to the pattern-formed surface of the substrate W, and includes, as shown in FIG. 9, an inert gas storing part 92, a pipe 93 and a valve 94. In the present specification, the "room temperature" described above means that the temperature falls within a temperature range of 5 to 35° C.

The inert gas supplying unit 91 may include a temperature adjusting part (unillustrated) which is electrically connected to the control unit 13. In this way, it is possible to heat or cool the inert gas stored in the inert gas storing part 92 by the operation instruction of the control unit 13 so as to perform temperature adjustment. The temperature adjustment is preferably performed such that the inert gas stored in the inert gas storing part 92 is maintained to have room temperature. The supply source of the inert gas may be utility facilities provided within a factory or the like.

The inert gas storing part 92 is connected through the pipe 93 with the pipeline to the nozzle 22, and the valve 94 is interposed partway through the path of the pipe 93. The gas within the inert gas storing part 92 is pressurized with an unillustrated fourth pressurization unit so as to be fed to the pipe 93. Since the fourth pressurization unit can be realized by pressurization with a pump or the like or by compressing and storing the gas into the inert gas storing part 92, any pressurization unit may be used.

The valve 94 is electrically connected to the control unit 13, and is normally closed. The opening and closing of the valve 94 is controlled by the operation instruction of the control unit 13. When the valve 94 is opened by the operation instruction of the control unit 13, the inert gas is passed through the pipe 93 and is supplied from the nozzle 22 to the front surface Wf of the substrate W.

In the inert gas storing part 92, an inert gas which is inert to at least the substrate W and the like, and more specifically, nitrogen gas, dry air or the like is stored. The nitrogen gas or the like stored may be subjected to temperature adjustment with the temperature adjusting part provided as necessary so as to maintain room temperature.

In the inert gas supplying unit 91 of the present embodiment, as a means for discharging the inert gas toward the front surface Wf of the substrate W, the nozzle 22, the arm 23 and the turning shaft 24 included in the substrate treating liquid supplying unit 21 are used. Since the details of the nozzle 22, the arm 23 and the turning shaft 24 are the same as described in the first embodiment, the description thereof will be omitted.

Since a substrate treating liquid which is used in the present embodiment is the same as that according to the first embodiment, the description thereof will be omitted.

<2-2 Substrate Treating Method>

A substrate treating method according to the second embodiment using the substrate treating apparatus 10 will then be described.

The substrate treating method of the second embodiment differs from the substrate treating method of the first embodiment not only in the use of the substrate treating apparatus 10 but also in the following points. Specifically, in the solidification step S14, instead of the supply of the coolant with the coolant supplying unit 81, the supply of the nitrogen gas is performed with the gas supplying unit 41. In the sublimation step S15, the supply of the coolant to the back surface Wb of the substrate W is not performed, and only the nitrogen gas is supplied. Furthermore, after the sublimation step S15 is performed, the inert gas supply step S16 such as for preventing condensation on the front surface Wf of the substrate W is performed.

Figure 10:
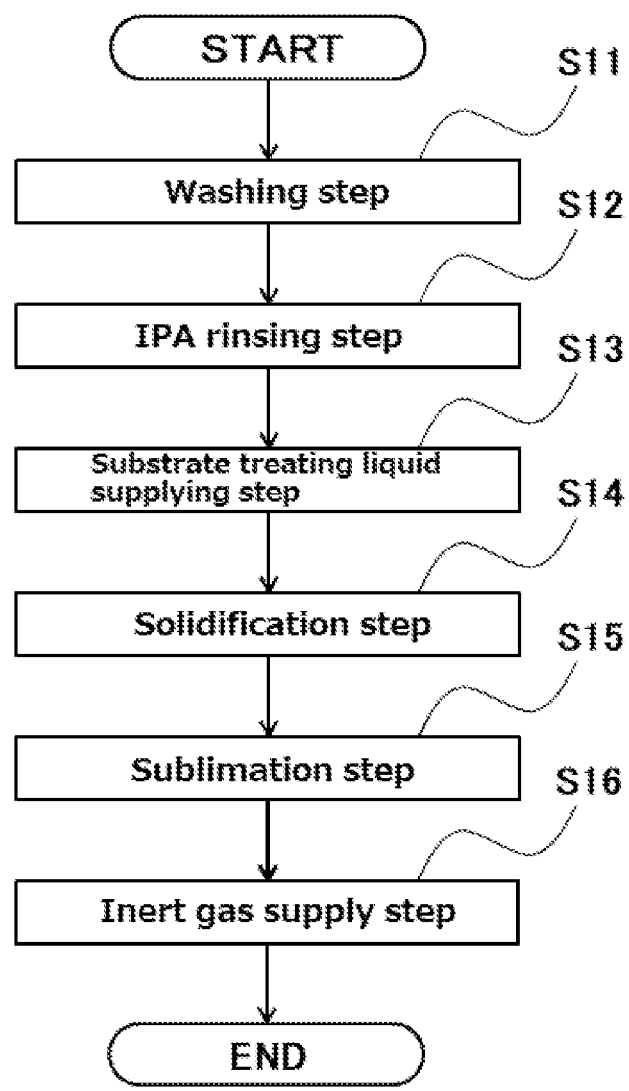
FIG. 10 is a flowchart showing a substrate treating method using the substrate treating apparatus.
Figure 11:
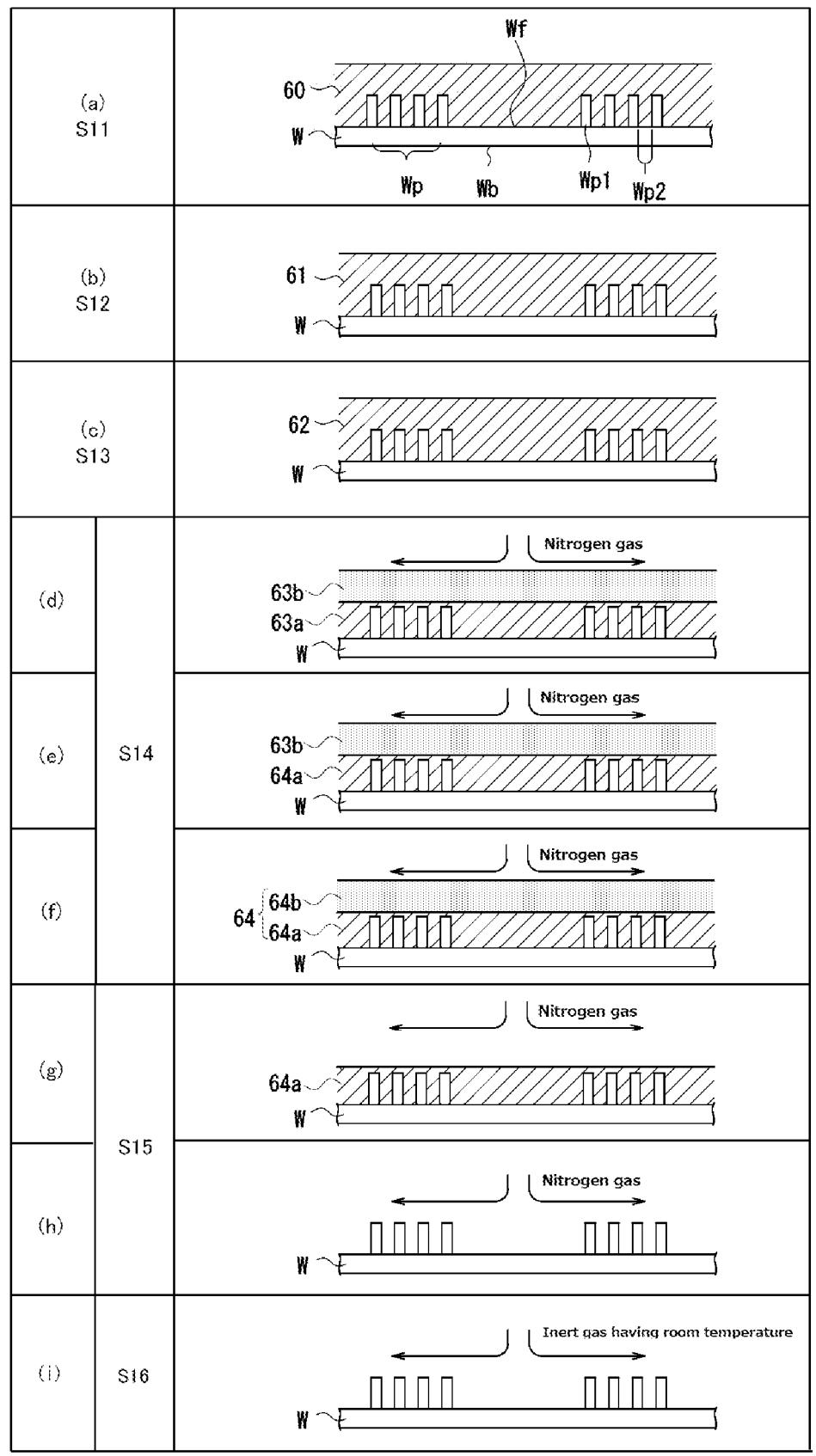
FIG. 11 is a diagram showing the state of the substrate in each step of the substrate treating method according to the second embodiment.

The steps of substrate treating will be described below with reference to FIGS. 2 and 9 to 11 as necessary. FIG. 10 is a flowchart showing the substrate treating method using the substrate treating apparatus 10. FIG. 11 is a schematic view showing the state of the substrate W in each step of FIG. 10. In the second embodiment, the washing step S11, the IPA rinsing step S12 and the substrate treating liquid supply step S13 shown in FIGS. 10 and 11(a) to 11(c) are the same as in the first embodiment, and thus the description thereof will be omitted.

Here, FIG. 11(a) shows a state of the substrate W in which the front surface Wf is covered by the liquid film of the DIW 60 when the washing step S11 in the second embodiment is completed, FIG. 11(b) shows a state of the substrate W in which the front surface Wf is covered by the liquid film of the IPA 61 when the IPA rinsing step S12 in the second embodiment is completed and FIG. 11(c) shows a state of the substrate W in which the front surface Wf is covered by the liquid film of the substrate treating liquid 62 containing the sublimable substance and the solvent when the substrate treating liquid supply step S13 in the second embodiment is completed.

The individual steps shown in FIGS. 11(a) to 11(e) are processed under the atmospheric pressure unless otherwise indicated. Here, the atmospheric pressure refers to an environment which is equal to or more than 0.7 atmospheres and equal to or less than 1.3 atmospheres with the standard atmospheric pressure (1 atmosphere, 1013 hPa) in the center. In particular, when the substrate treating apparatus 1 is arranged within a clean room having a positive pressure, the pressure of the front surface Wf of the substrate W is higher than 1 atmosphere.

With reference to FIG. 10, after the washing step S11, the IPA rinsing step S12 and the substrate treating liquid supply step S13 are performed, the solidification step S14 is performed in which the liquid film of the substrate treating liquid 62 supplied to the front surface Wf of the substrate W is solidified so as to form the solidified body containing the sublimable substance and the solvent. Specifically, the control unit 13 first provides the operation instruction to the rotation drive portion 52 such that the substrate W is rotated about the axis A1 at a constant speed. Here, the rotation speed of the substrate W is preferably set such that the thickness of the film formed of the substrate treating liquid is higher than the height of the convex portions Wp1 on the entire front surface Wf.

Then, the control unit 13 provides the operation instruction to the revolvingly driving part 14 such that the nozzle 42 is located in the center portion of the front surface Wf of the substrate W. Then, the control unit 13 provides the operation instruction to the valve 46 such that the valve 46 is opened. In this way, the gas (in the present embodiment, nitrogen gas having a temperature of −10° C.) is supplied from the gas storing part 47 through the pipe 45 and the nozzle 42 toward the front surface Wf of the substrate W.

The nitrogen gas supplied to the front surface Wf of the substrate W is made to flow from around the center of the front surface Wf of the substrate W toward the direction of the circumferential edge portion of the substrate W by the centrifugal force generated by the rotation of the substrate W so as to be diffused over the entire front surface Wf of the substrate W covered by the liquid film of the substrate treating liquid 62. In this way, the liquid film of the substrate treating liquid 62 formed on the front surface Wf of the substrate W is cooled to a temperature equal to or less than the freezing points of the sublimable substance and the solvent. Here, for the same reason as described in the first embodiment, on the front surface Wf of the substrate W, the solidified body 64 is formed in which the lower side solidified body layer 64a and the upper side solidified body layer 64b are sequentially stacked. Here, the film thickness of the lower side solidified body layer 64a is preferably equal to or higher than the convex portion Wp1 of the pattern in the entire front surface Wf.

When the temperature of the nitrogen gas for cooling the substrate treating liquid is higher than the freezing point of the liquid layer part in which the sublimable substance is present in the saturated state, the sublimable substance is present in a liquid state without the upper side solidified body layer being formed. In this case, for example, immediately after the solidification step S14, the spin-off step may be performed that spins off the liquid layer part 63b in which the sublimable substance is present in the saturated state by utilization of the action of the centrifugal force generated by the rotation of the substrate W.

FIG. 11(d) shows a state where the liquid layer part 63a in which the excessive amount of sublimable substance is settled and the liquid layer part 63b in which the sublimable substance is present in the saturated state are formed on the substrate W by the cooling of the substrate treating liquid in the solidification step S14. FIG. 11(e) shows a state where the liquid layer part 63a in which the excessive amount of sublimable substance is settled is first solidified so as to form the lower side solidified body layer 64a. FIG. 11(f) shows a state where the liquid layer part 63b in which the sublimable substance is present in the saturated state is solidified so as to form the upper side solidified body layer 64b and where thus the solidified body 64 is obtained.

Although in the second embodiment, the nitrogen gas is used so as to cool the substrate treating liquid, in the practice of the present invention, there is no limitation to the nitrogen gas as long as a gas inert to the sublimable substance and the solvent is used. Specific examples of the gas inert to the sublimable substance and the solvent include helium gas, neon gas, argon gas, air (mixed gas of 80% of nitrogen gas by volume and 20% of oxygen gas by volume) and the like. Alternatively, the inert gas may be a mixed gas obtained by mixing a plurality of types of gases among these gases.

With reference back to FIG. 10, the sublimation step S15 of subliming the solidified body 64 of the substrate treating liquid formed on the front surface Wf of the substrate W so as to remove it from the front surface Wf of the substrate W is then performed. Even in the sublimation step S15, the supply of the nitrogen gas from the nozzle 42 is continued from the solidification step S14.

Here, the partial pressure of the vapor of the sublimable substance in the nitrogen gas is set lower than the saturated vapor pressure of the sublimable substance at a temperature when the nitrogen gas is supplied. Hence, the nitrogen gas described above makes contact with the solidified body 64, and thus the upper side solidified body layer 64b in the solidified body 64 is first sublimed. Thereafter, the lower side solidified body layer 64a is sublimed, and thus all the solidified body 64 is sublimed. Since the nitrogen gas has a temperature lower than the freezing points of the sublimable substance and the solvent, it is possible to sublime the solidified body 64 of the substrate treating liquid while preventing the melting of the solidified body 64 of the substrate treating liquid.

Hence, when the substances such as the IPA present on the front surface Wf of the substrate W are removed, the substances such as the IPA present on the front surface Wf of the substrate W are replaced by the substrate treating liquid, the substrate treating liquid is solidified, the solidified body of the substrate treating liquid is sublimed and thus it is possible to satisfactorily dry the front surface Wf of the substrate W while reducing the collapse of the pattern caused by the surface tension of the substrate treating liquid on the pattern Wp.

FIG. 11(g) shows a state of the substrate W when the sublimation of the upper side solidified body layer 64b is completed in the sublimation step S15. FIG. 11(h) shows a state of the substrate W when the sublimation of the lower side solidified body layer 64a is completed. As shown in FIGS. 11(g) and 11(h), the solidified body 64 formed in the solidification step S14 is sublimed by the supply of the nitrogen gas having a temperature of −10° C. so as to be removed from the front surface Wf, with the result that the drying of the front surface Wf of the substrate W is completed.

After the completion of the sublimation step S15, the control unit 13 provides the operation instruction to the valve 46 such that the valve 46 is closed. The control unit 13 also provides the operation instruction to the revolvingly driving part 14 such that the nozzle 42 is located in the retraction position P3.

With reference back to FIG. 10, the inert gas supply step S16 is performed which supplies the inert gas having room temperature to the front surface Wf of the substrate W after the removal of the solidified body 64 by the sublimation. The control unit 13 first provides the operation instruction to the rotation drive portion 52 such that the substrate W is rotated about the axis A1 at a constant speed. Here, the rotation speed of the substrate W is preferably equal to or more than a rotation speed at which the inert gas supplied can be made to flow from around the center of the front surface Wf of the substrate W toward the direction of the circumferential edge portion of the substrate W.

Then, the control unit 13 provides the operation instruction to the revolvingly driving part 14 such that the nozzle 22 is located in the center portion of the front surface Wf of the substrate W. Then, the control unit 13 provides the operation instruction to the valve 94 such that the valve 94 is opened. In this way, the inert gas is supplied from the inert gas storing part 92 through the pipe 93 and the nozzle 22 to the front surface Wf of the substrate W. When the valve 94 is opened, the valve 26 which is used when the substrate treating liquid is supplied is closed.

The temperature of the inert gas supplied is room temperature (5 to 35° C.), the inert gas is supplied on the front surface Wf of the substrate W and thus it is possible to prevent the occurrence of condensation. It is also possible to remove particles and the like which are adhered on the front surface Wf as the residue, and thus it is possible to prevent the yield from being lowered by involvement of the particles.

In this way, a series of substrate dry treating steps are completed. After the substrate dry treating as described above, the substrate W on which the dry treating has been performed is unloaded from the chamber 11 by the unillustrated substrate loading/unloading mechanism.

In the second embodiment, in the solidification step S14 and the sublimation step S15, the common gas supplying unit 41 is used, and thus the nitrogen gas which is a gas inert to the sublimable substance and the solvent is supplied at a temperature equal to or less than the freezing point of the sublimable substance. In this way, immediately after the solidification step S14, the sublimation step S15 can be started, a treating time necessary for operating the individual portions of the substrate treating apparatus 1 and the amount of memory in the substrate treating program 19 of the control unit 13 to be operated can be reduced and the number of components used in the treating can be reduced, with the result that it is possible to reduce the cost of the apparatus. In particular, in the present embodiment, the pressure reduction unit 71 is not used, and thus the pressure reduction unit 71 can be omitted.

(Variations)

In the above discussion, the preferred embodiments of the present invention are described. However, the present invention is not limited to these embodiments, and can be practiced in other various forms. The major ones of the other various forms will be illustrated below.

In the first and second embodiments, within the one chamber 11, the individual steps are performed on the substrate W. However, there is no limitation to this configuration in the practice of the present invention, and the chamber may be prepared for each of the steps.

For example, in each of the embodiments, a configuration may be adopted in which the steps up to the solidification step S14 are performed in a first chamber, in which after the solidified body is formed on the front surface Wf of the substrate W, the substrate W is unloaded from the first chamber, in which the substrate W where the solidified body is formed is loaded into a separate second chamber and in which the sublimation step S15 is performed in the second chamber.

In the sublimation step S15 of the first embodiment, the nitrogen gas is supplied with the gas supplying unit 41 while the supply of the coolant with the coolant supplying unit 81 is being continued. However, there is no limitation to this configuration in the practice of the present invention, and the supply of the nitrogen gas with the gas supplying unit 41 may be stopped such that the sublimable substance and the solvent in the solidified body 64 of the substrate treating liquid are naturally sublimed while the coolant is being supplied with the coolant supplying unit 81.

Furthermore, in the first embodiment, the coolant supplying unit 81 is used in the solidification step S14, and the gas supplying unit 41 is used in the sublimation step S15. In the second embodiment, the gas supplying unit 41 is used in the solidification step S14 and the sublimation step S15. However, in the present invention, the individual unit in these individual steps may be replaced by the pressure reduction unit 71. Specifically, in the solidification step S14, the control unit 13 provides the operation instruction to the exhaust pump 72 such that the drive of the exhaust pump 72 is started. Then, the control unit 13 provides the operation instruction to the valve 74 such that the valve 74 is opened. In this way, the gas within the chamber 11 is exhausted through the pipe 73 to the outside of the chamber 11. The interior of the chamber 11 is brought into a sealed state except the pipe 73, and thus the internal environment of the chamber 11 is reduced in pressure from the atmospheric pressure.

The pressure reduction is performed from the atmospheric pressure (about 1 atmosphere, about 1013 hPa) to about $1.7 \times 10^{-5}$ atmospheres (1.7 Pa). There is no limitation to the pressure described above in the practice of the invention of the present application, and the gas pressure within the chamber 11 after the pressure reduction may be set as necessary according to the pressure resistance and the like of the chamber 11 and the like. The interior of the chamber 11 is reduced in pressure, and thus the sublimable substance is evaporated from the substrate treating liquid 62 supplied to the front surface Wa of the substrate W. Here, the heat of the evaporation is removed from the substrate treating liquid 62, and thus the substrate treating liquid 62 is cooled so as to be solidified.

In the sublimation step S15, by the pressure reduction treating, the pressure of the environment within the chamber 11 is lower than the saturated vapor pressure of the sublimable substance. Consequently, the pressure reduction environment described above is maintained, and thus the solidified body 64 is sublimed.

EXAMPLES

Preferred examples of this invention will be illustratively described in detail below. However, unless otherwise restrictively described, materials, mixed amounts and the like described in the examples are not intended to limit the scope of this invention.

(Substrate with Pattern)

As a substrate with a pattern, a silicon substrate in which a model pattern was formed on its front surface was prepared, and a 1 cm square coupon (sample) was cut out from the silicon substrate. As the model pattern, a pattern was adopted in which cylinders (whose aspect ratio was about 20) having a diameter of about 30 nm and a height of about 600 nm were aligned.

Example 1

In the present example, the coupon cut out from the silicon substrate was used, dry treating was performed by a procedure described below and thus the effect of reducing the collapse of the pattern was evaluated.

Ultraviolet light was first applied to the front surface of the coupon, and thus the property of the front surface became hydrophilic. In this way, a liquid easily entered the concave portions of the pattern, and thus after the supply of the liquid, an environment in which the collapse of the pattern easily occurred was artificially formed.

Then, after the coupon was put into a vial, 5 ml of a substrate treating liquid whose temperature was 40° C. at room temperature (23° C.) under the atmospheric pressure (1 atmosphere) was put thereinto, and thus in the pattern-formed surface of the coupon, a liquid film formed of the substrate treating liquid was formed. As the substrate treating liquid, a saturated aqueous solution of 1,1,2,2,3,3,4-heptafluorocyclopentane (sublimable substance: 1,1,2,2,3,3,4-heptafluorocyclopentane, solvent: DIW) was used. The concentration of 1,1,2,2,3,3,4-heptafluorocyclopentane was set to a saturated concentration at 40° C.

The freezing point of 1,1,2,2,3,3,4-heptafluorocyclopentane was 20.5° C., and the density thereof was 1.58 g/cm$^3$ at a temperature of 25° C.

Then, the vial was placed within a freezing chamber, the liquid film was solidified under the atmospheric pressure (1 atmosphere) in a temperature of −10° C. and thus a solidified body was formed on the pattern-formed surface of the coupon. The solidified body described above was formed by sequentially stacking the lower side solidified body layer and the upper side solidified body layer on the pattern-formed surface of the coupon. The lower side solidified body layer was formed of an amount of 1,1,2,2,3,3,4-heptafluorocyclopentane which was so excessive as to be settled, and the upper side solidified body layer was formed of the saturated aqueous solution of 1,1,2,2,3,3,4-heptafluorocyclopentane.

Furthermore, the temperature within the freezing chamber was set to 0° C., the vial continued to be placed and thus the upper side solidified body layer and the lower side solidified body layer were substantially sublimed while the melting of the solidified body was being prevented, with the result that the solidified body was removed from the pattern-formed surface of the coupon.

After the removal of the solidified body was confirmed, the coupon was removed from the vial, the collapse rate of the pattern was calculated and thus with the collapse rate, the effect of reducing the collapse of the pattern in the pattern-formed surface was evaluated.

The collapse rate described above was a value which was calculated by a formula below.

collapse rate (%)=(the number of convex portions collapsed in an arbitrary region)/(the total number of convex portions in the region)×100

Examples 2 and 3

In examples 2 and 3, the temperature of the substrate treating liquid was individually set to 60° C. or 80° C., and the concentration of 1,1,2,2,3,3,4-heptafluorocyclopentane was set to the saturated concentration at each temperature. The conditions other than those described above were set as in example 1, and the drying treating on the pattern-formed surface of the coupon in the present example was performed.

Reference Example 1

In reference example 1, the temperature of the substrate treating liquid which was put into the vial was set to room temperature (25° C.), the mass percent concentration of 1,1,2,2,3,3,4-heptafluorocyclopentane in the substrate treating liquid was changed to 0.072 mass %, the conditions other than those described above were set as in example 1 and the drying treating on the pattern-formed surface of the coupon in the present reference example was performed.

Comparative Example 1

In comparative example 1, as the substrate treating liquid, 1,1,2,2,3,3,4-heptafluorocyclopentane in a molten state was used, the temperature of the substrate treating liquid which was put into the vial was set to room temperature (23° C.), the conditions other than those described above were set as in example 1 and the drying treating on the pattern-formed surface of the coupon in the present comparative example was performed.

Comparative Examples 2 and 3

In comparative examples 2 and 3, as the substrate treating liquid, the DIW was used, the temperature of the substrate treating liquid which was put into the vial was individually set to 23° C. or 60° C., the conditions other than those described above were set as in example 1 and the drying treating on the pattern-formed surface of the coupon in each of the comparative examples was performed.

(Results)

The results of examples 1 to 3, reference example 1 and comparative examples 1 to 3 are shown in table 1. The collapse rates of examples 1 to 3 were respectively 23.4%, 28.5% and 21.0%, and the collapse rate of comparative example 1 was 21.7%. In other words, the collapse rates when the saturated aqueous solutions of 1,1,2,2,3,3,4-heptafluorocyclopentane at 40° C., 60° C. and 80° C. were used as the substrate treating liquid were substantially equal to the collapse rates when 1,1,2,2,3,3,4-heptafluorocyclopentane in the molten state was used as the substrate treating liquid. On the other hand, the collapse rate of reference example 1 was 74.9%, and the collapse rates of comparative examples 2 and 3 were respectively 79.2% and 84.3%. In reference example 1, it was impossible to reduce the collapse of the pattern. This is considered to be because the thickness of the solidified body layer of 1,1,2,2,3,3,4-heptafluorocyclopentane was lower than the height of the pattern. When the thickness of the solidified body layer is lower than the height of the pattern, a surface tension acts on the pattern, and thus the collapse of the pattern occurs, with the result that the collapse rate is increased.

In examples 1 to 3, the saturated aqueous solutions of 1,1,2,2,3,3,4-heptafluorocyclopentane at 40° C., 60° C. and 80° C. were used as the substrate treating liquid, and thus as compared with comparative example 1 in which 1,1,2,2,3,3,4-heptafluorocyclopentane in the molten state was used as the substrate treating liquid, it was possible to reduce the amount of 1,1,2,2,3,3,4-heptafluorocyclopentane used while maintaining a satisfactory collapse rate which was substantially equal thereto.

TABLE 1

| | Example 1 | Example 2 | Example 3 | Reference example 1 | Comparative example 1 | Comparative example 2 | Comparative example 3 |
|---|---|---|---|---|---|---|---|
| Sublimable substance | 1,1,2,2,3,3,4-heptafluorocyclopentane | | | | | — | — |
| Solvent | DIW | | | | — | DIW | |
| Temperature of substrate treating liquid (° C.) | 40 | 60 | 80 | 25 | 23 | 23 | 60 |
| Concentration of substrate treating liquid in substrate treating liquid (mass %) | Saturation | Saturation | Saturation | 0.072 | 100 | — | — |
| collapse rate (%) | 23.4 | 28.5 | 21.0 | 74.9 | 21.7 | 79.2 | 84.3 |

CITATION LIST 1 substrate treating apparatus
11 chamber
12 scattering prevention cup
13 control unit
14 revolvingly driving part
15 computation processing part
17 memory
19 substrate processing program
21 substrate treating liquid supplying unit (supplying unit)
22 nozzle
23 arm
24 turning shaft
25 pipe
26 valve
27 substrate treating liquid storing part
31 IPA supplying unit
32 nozzle
33 arm
34 turning shaft
35 pipe
36 valve
37 IPA tank
41 gas supplying unit (solidifying unit, sublimating unit)
42 nozzle
43 arm
44 turning shaft
45 pipe
46 valve
47 gas storing part
51 substrate holding unit
52 rotarily driving part
53 spin base
54 chuck pin 61 IPA
62 substrate treating liquid
63a liquid layer part where an excessive amount of sublimable substance is settled
63b liquid layer part where sublimable substance is present in a saturated state
64 solidified body
64a lower side solidified body layer
64b upper side solidified body layer
65 coolant
71 pressure reduction unit (solidifying unit, sublimating unit)
72 exhaust pump
74 valve
81 coolant supplying unit (solidifying unit, sublimating unit)
82 coolant storing part
83 pipe
84 valve
271 substrate treating liquid storage tank
272 temperature adjusting part
273 separation part
274 pressurization part
275 nitrogen gas tank
276 pump
277 pipe
278 agitation part
278a rotation part
278b agitation control part
471 gas tank
472 gas temperature adjusting part
821 coolant tank
822 coolant temperature adjusting part
A1, J1, J2, J3, J4 axis
AR1, AR2, AR3, AR4 arrow
P1, P2, P3, P4 retraction position
S11 washing step
S12 IPA rinsing step
S13 substrate treating liquid supply step (supply step)
S14 solidification step
S15 sublimation step
W substrate
Wf front surface of substrate
Wb back surface of substrate
Wp pattern of front surface of substrate
Wp1 convex portion (of pattern)
Wp2 concave portion (of pattern)

The invention claimed is:

1. A substrate treating method comprising:
a supply step of supplying a substrate treating liquid to a pattern-formed surface of a substrate;
a solidification step of solidifying the substrate treating liquid on the pattern-formed surface so as to form a solidified body; and
a sublimation step of subliming the solidified body so as to remove the solidified body from the pattern-formed surface,
wherein as the substrate treating liquid, a substrate treating liquid is used which includes a sublimable substance in a molten state and a solvent, a freezing point of the sublimable substance is higher than a freezing point of the substrate treating liquid, and when solubility of the sublimable substance in the solvent is lowered, an excessive amount of the sublimable substance whose density is higher than a density of the substrate treating liquid is settled, and
in the solidification step, in the substrate treating liquid supplied to the pattern-formed surface in the supply step, the solubility of the sublimable substance in the solvent is lowered such that the excessive amount of the sublimable substance is settled, and the settled sublimable substance is solidified so as to have a height equal to or higher than a height of a pattern in the pattern-formed surface, and thereafter a liquid layer part in which the sublimable substance is saturated is further solidified so as to form the solidified body, and
in the sublimation step, the liquid layer part solidified in the solidification step is sublimed, and thereafter the solidified sublimable substance is sublimed.

2. The substrate treating method according to claim 1, wherein in the supply step, the substrate treating liquid is supplied to the pattern-formed surface of the substrate under atmospheric pressure, and
in the solidification step, the substrate treating liquid is cooled under the atmospheric pressure to a temperature equal to or less than the freezing points of the sublimable substance and the solvent.

3. The substrate treating method according to claim 1, wherein in the supply step, before the substrate treating liquid is supplied to the pattern-formed surface, a temperature of the substrate treating liquid is adjusted to be equal to or more than melting points of the sublimable substance and the solvent and less than boiling points thereof.

4. The substrate treating method according to claim 1, wherein in the supply step, before the substrate treating liquid is supplied to the pattern-formed surface, the sublimable substance settled in the substrate treating liquid is removed from the substrate treating liquid.

5. The substrate treating method according to claim 1, wherein the sublimable substance is sublimable under the atmospheric pressure, and
in the sublimation step, the sublimable substance is sublimed under the atmospheric pressure.

6. The substrate treating method according to claim 1, wherein in at least one of the solidification step and the sublimation step, a coolant is supplied toward a back surface on a side opposite to the pattern-formed surface of the substrate at a temperature equal to or less than the freezing points of the sublimable substance and the solvent.

7. The substrate treating method according to claim 1, wherein in at least one of the solidification step and the sublimation step, an inert gas which is inert to at least the sublimable substance and the solvent is supplied toward the pattern-formed surface at a temperature equal to or less than the freezing points of the sublimable substance and the solvent.

8. The substrate treating method according to claim 1, wherein in the sublimation step, an inert gas which is inert to at least the sublimable substance and the solvent is supplied toward the pattern-formed surface at a temperature equal to or less than the freezing points of the sublimable substance and the solvent, and a coolant is supplied toward a back surface on a side opposite to the pattern-formed surface of the substrate at the temperature equal to or less than the freezing points of the sublimable substance and the solvent.

9. The substrate treating method according to claim 1, wherein in the sublimating step, the pattern-formed surface on which the solidified body is formed is reduced in pressure to an environment lower than atmospheric pressure.

10. A substrate treating method comprising:
a supply step of supplying a substrate treating liquid to a pattern-formed surface of a substrate;
a solidification step of solidifying the substrate treating liquid on the pattern-formed surface so as to form a solidified body; and
a sublimation step of subliming the solidified body so as to remove the solidified body from the pattern-formed surface,
wherein as the substrate treating liquid, a substrate treating liquid is used which includes a sublimable substance in a molten state and a solvent, a freezing point of the sublimable substance is higher than a freezing point of the substrate treating liquid, and when solubility of the sublimable substance in the solvent is lowered, an excessive amount of the sublimable substance whose density is higher than a density of the substrate treating liquid is settled,
the sublimable substance is a fluorinated carbon compound, which is at least any one of the following compounds (A) to (E):
a compound (A): a fluoroalkane having 3 to 6 carbon atoms, or the fluoroalkane to which at least one selected from the group consisting of the following is bonded: halogen groups except a fluoro group, a hydroxyl group, an oxygen atom, a carboxyl group, and perfluoroalkyl groups;
a compound (B): a fluorocycloalkane having 3 to 6 carbon atoms, or the fluorocycloalkane to which at least one selected from the group consisting of the following is bonded: halogen groups except a fluoro group, a hydroxyl group, an oxygen atom, a carboxyl group, and perfluoroalkyl groups;
a compound (C): a fluorobicycloalkane having 10 carbon atoms, or the fluorobicycloalkane to which at least one selected from the group consisting of the following is bonded: halogen groups except a fluoro group, cycloalkyl groups which may each have a halogen atom, and alkyl groups each having a cycloalkyl group which may have a halogen atom;
a compound (D): a fluorotetracyanoquniodimethane, or the fluorotetracyanoquniodimethane to which at least one halogen radical except a fluoro group is bonded; and
a compound (E): a fluorocyclotriphosphazene, or the fluorocyclotriphosphazene to which at least one selected from the group consisting of the following is bonded: halogen groups except a fluoro group, a phenoxy group, and alkoxy groups, and
in the solidification step, in the substrate treating liquid supplied to the pattern-formed surface in the supply step, the solubility of the sublimable substance in the solvent is lowered such that the excessive amount of the sublimable substance is settled, and the settled sublimable substance is solidified so as to have a height equal to or higher than a height of a pattern in the pattern-formed surface.

11. A substrate treating liquid which includes a sublimable substance in a molten state and a solvent,
wherein the sublimable substance is a fluorinated carbon compound which is at least any of the following compounds (A) to (E):
a compound (A): a fluoroalkane having 3 to 6 carbon atoms, or the fluoroalkane to which at least one selected from the group consisting of the following is bonded: halogen groups except a fluoro group, a hydroxyl group, an oxygen atom, an alkyl group, a carboxyl group, and perfluoroalkyl groups;
a compound (B): a fluorocycloalkane having 3 to 6 carbon atoms, or the fluorocycloalkane to which at least one selected from the group consisting of the following is bonded: halogen groups except a fluoro group, a hydroxyl group, an oxygen atom, an alkyl group, a carboxyl group, and perfluoroalkyl groups;
a compound (C): a fluorobicycloalkane having 10 carbon atoms, or the fluorobicycloalkane to which at least one selected from the group consisting of the following is bonded: halogen groups except a fluoro group, cycloalkyl groups which may each have a halogen atom, and alkyl groups each having a cycloalkyl group which may have a halogen atom;
a compound (D): a fluorotetracyanoquinodimethane, or the fluorotetracyanoquinodimethane to which at least one halogen radical except a fluoro group is bonded; and
a compound (E): a fluorocyclotriphosphazene, or the fluorocyclotriphosphazene to which at least one selected from the group consisting of the following is bonded: halogen groups except a fluoro group, a phenoxy group, and alkoxy groups, and a freezing point of the sublimable substance is higher than a freezing point of the substrate treating liquid, and
when solubility of the sublimable substance in the solvent is lowered, an excessive amount of the sublimable substance whose density is higher than a density of the substrate treating liquid is settled.

12. A substrate treating apparatus comprising:
a supplying unit adapted for supplying a substrate treating liquid to a pattern-formed surface of a substrate, wherein as the substrate treating liquid, a substrate treating liquid is used which includes a sublimable substance in a molten state and a solvent, a freezing point of the sublimable substance is higher than a freezing point of the substrate treating liquid, and when solubility of the sublimable substance in the solvent is lowered, an excessive amount of the sublimable substance whose density is higher than a density of the substrate treating liquid is settled;
a solidifying unit adapted for solidifying the substrate treating liquid on the formed surface so as to form a solidified body; and
a sublimating unit adapted for subliming the solidified body so as to remove the solidified body from the formed surface,
wherein the supplying unit includes a separation part which removes, from the substrate treating liquid, the sublimable substance separated in the substrate treating liquid, and
the substrate treating liquid which is supplied to the pattern-formed surface of the substrate is a substrate treating liquid in which the separated sublimable substance has been removed with the separation part,
the solidifying unit adapted for performing in such a manner that, in the substrate treating liquid supplied to the pattern-formed surface by the supplying unit, the solubility of the sublimable substance in the solvent is lowered such that the excessive amount of the sublimable substance is settled, and the settled sublimable substance is solidified so as to have a height equal to or higher than a height of a pattern in the pattern-formed surface, and after the excessive amount of the sublimable substance settled is solidified, a liquid layer part in which the sublimable substance is saturated is further solidified so as to form the solidified body, and the sublimating unit adapted for performing in such a manner that the liquid layer part solidified by the solidifying unit is sublimed, and thereafter the solidified sublimable substance is sublimed.

\* \* \* \* \*